(12) United States Patent
Park et al.

(10) Patent No.: US 11,271,569 B2
(45) Date of Patent: Mar. 8, 2022

(54) ENHANCED THRESHOLD VOLTAGE DEFINED LOGIC FAMILY

(71) Applicant: University of Florida Research Foundation, Inc., Gainesville, FL (US)

(72) Inventors: Beomsoo Park, Gainesville, FL (US); Nima Maghari, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 17/136,887

(22) Filed: Dec. 29, 2020

(65) Prior Publication Data

US 2021/0211131 A1 Jul. 8, 2021

Related U.S. Application Data

(60) Provisional application No. 62/958,393, filed on Jan. 8, 2020.

(51) Int. Cl.
*H03K 19/20* (2006.01)
*H03K 19/0944* (2006.01)

(52) U.S. Cl.
CPC ......... *H03K 19/20* (2013.01); *H03K 19/0944* (2013.01)

(58) Field of Classification Search
None
See application file for complete search history.

(56) References Cited

U.S. PATENT DOCUMENTS

2012/0200313 A1* 8/2012 Kyue ................. H03K 19/0019
326/8

OTHER PUBLICATIONS

Collantes et al. "Threshold-Dependent Camouflaged Cells to Secure Circuits Against Reverse Engineering Attacks". 6 pages. May 2016.
Erbagci et al. "A Secure Camouflaged Threshold Voltage Defined Logic Family". IEEE International Symposium on Hardware Oriented Security and Trust (HOST). pp. 229-235. 2016.
Nirmala et al. "A Novel Threshold Voltage Defined Switch for Circuit Camouflaging". 21st IEEE European Test Symposium (ETS). 2 pages. 2016.

* cited by examiner

*Primary Examiner* — Jany Richardson
(74) *Attorney, Agent, or Firm* — Thomas | Horstemeyer, LLP

(57) ABSTRACT

The present disclosure describes systems, apparatuses, and methods for implementing a logic gate circuit structure for operating one or more Boolean functions. Instead of stacking transistors in series to accommodate an increased number of inputs, a parallel configuration is presented that significantly reduces the cascaded number of transistors and the total number of transistors for the same functionality.

20 Claims, 54 Drawing Sheets

\<XNOR\>

*parallel configuration*

*additional current path and XOR logic*

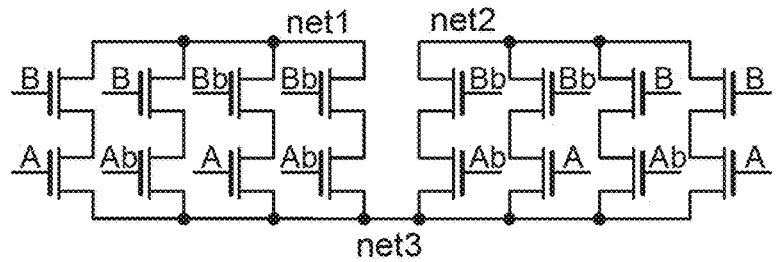
FIG. 9C
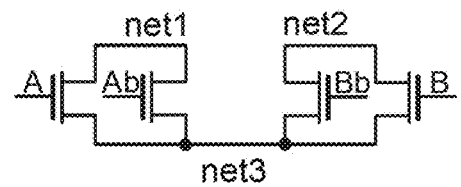
FIG. 9D
| <NAND> | | | | | <NOR> | | | | | <XNOR> | | | |
|---|---|---|---|---|---|---|---|---|---|---|---|---|---|
| Input | | Output | | | Input | | Output | | | Input | | Output | |
| A | B | OUT | OUTb | | A | B | OUT | OUTb | | A | B | OUT | OUTb |
| 0 | 0 | 1 | 0 | | 0 | 0 | 1 | 0 | | 0 | 0 | 1 | 0 |
| 0 | 1 | 1 | 0 | | 0 | 1 | 0 | 1 | | 0 | 1 | 0 | 1 |
| 1 | 0 | 1 | 0 | | 1 | 0 | 0 | 1 | | 1 | 0 | 0 | 1 |
| 1 | 1 | 0 | 1 | | 1 | 1 | 0 | 1 | | 1 | 1 | 1 | 0 |
FIG. 10

XOR logic turned on for 01 & 10 input

< E-TVD logic gate >

ENHANCED THRESHOLD VOLTAGE DEFINED LOGIC FAMILY

CROSS-REFERENCE TO RELATED APPLICATION

This application claims priority to U.S. provisional application entitled, "Enhanced Threshold Voltage Defined Logic Family," having Ser. No. 62/958,393, filed Jan. 8, 2020, which is entirely incorporated herein by reference.

STATEMENT REGARDING FEDERALLY SPONSORED RESEARCH OR DEVELOPMENT

This invention was made with government support under 1610075 awarded by National Science Foundation. The government has certain rights in the invention.

BACKGROUND

With the recent advances in the imaging techniques, hardware intellectual properties (IPs) and integrated circuits (ICs) are prone to reverse engineering. Although reverse engineering provides benefits to learn and understand diverse IPs and ICs, it is often associated with illegal issues related to security such as IP/IC piracy, counterfeiting, Trojan insertion, etc. Recently, diverse logic families leveraging the different threshold voltage ($V_T$) devices provided in general CMOS technologies is presented in order to conceal and protect hardware IPs/ICs against reverse engineering. The functionality of the logic in these designs cannot be distinguished through its physical appearance as these gates leverage different $V_T$ implants which is hard to identify through reverse engineering.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 9C illustrates a conventional logic gate circuit device structure for a 2-input configuration.

FIG. 9D illustrates a conventional 2-input configuration for an exemplary logic gate circuit device structure in accordance with embodiments of the present disclosure.

FIG. 10 shows a truth table for 2-input NAND, NOR, and XNOR logic gates.

DETAILED DESCRIPTION

The present disclosure describes systems, apparatuses, and methods for implementing a logic gate circuit structure for operating one or more Boolean functions. In particular, embodiments of systems, apparatuses, and methods for a sense amplifier-based threshold voltage defined (TVD) logic family are presented. For example, instead of stacking transistors in series to accommodate an increased number of inputs, an efficient way of implementation is presented that significantly reduces the cascaded number of transistors and the total number of transistors for the same functionality. The performance of an exemplary design in accordance with present disclosure excels the conventional TVD design in all aspects such as area, delay, and power consumption.

Figure 1:
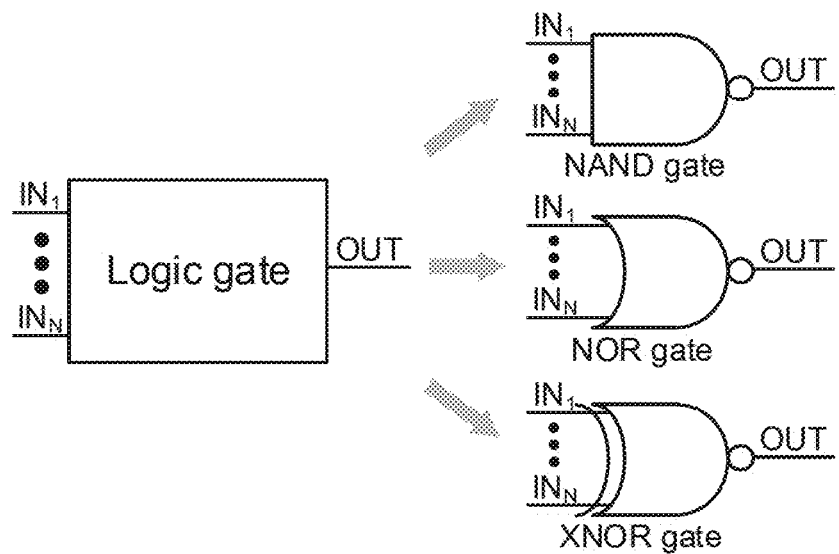
FIG. 1 illustrates an overall concept of one embodiment of the present disclosure.

Although reverse engineering provides benefits to learn and understand diverse IPs and ICs, it is often associated with illegal issues as it reveals the design to other third parties (other companies). Thus, obfuscating the design is a major concern for IP/IC designers. Developing a circuit that operates in many different ways which cannot be recognized by others is becoming essential in today's IP/IC design. The present disclosure provides an efficient logic circuit (gate) that can operate in many different ways (many different Boolean functions) that cannot be detected through reverse engineering. An overall concept of one embodiment of the present disclosure is illustrated in FIG. 1.

Figure 2:
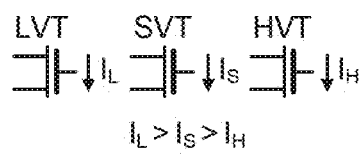
FIG. 2 illustrates a comparison between different threshold voltage devices in accordance with the present disclosure.

A sense-amplifier based circuit is used to implement the logic family. Different threshold voltage devices (transistors) are used to configure the sense-amplifier based circuit to operate for different Boolean functions such as NAND, NOR, and XNOR gates. The different threshold voltages of the transistors cause different amount of currents to be conducted when the transistors are on (e.g., when the gate terminal of the device is high for NMOS transistors and is low for PMOS transistors). The different threshold voltage devices provided in a general CMOS process is low-threshold voltage transistor (LVT), standard-threshold voltage transistor (SVT), and high-threshold voltage transistor (HVT). The current conducted by each device (when the geometry is the same) is shown in FIG. 2 where LVT devices conduct more current than the others ($I_L > I_S > I_H$) due to low threshold voltage.

A conventional way of implementing this circuit will be first discussed. The conventional threshold voltage defined (TVD) logic family for a 2-input logic gate (A and B input and its complementary signals Ab and Bb) and its operation is shown in FIG. 3.

Figure 3:
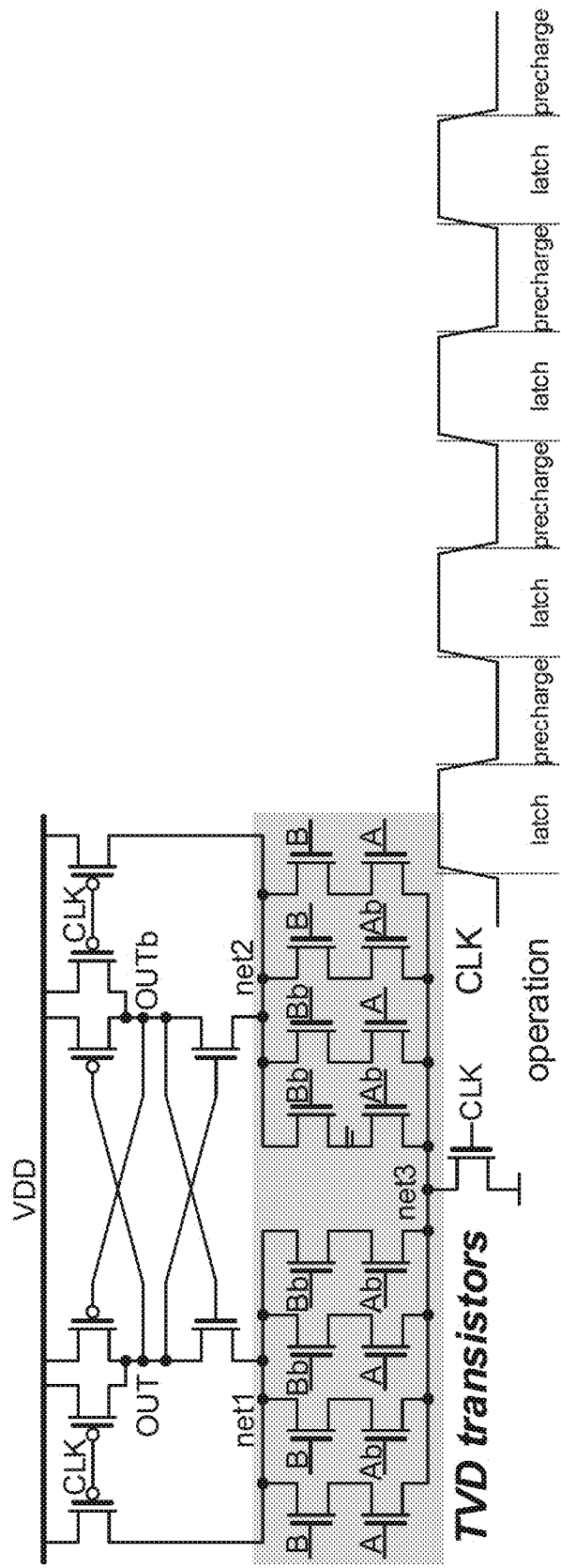
FIG. 3 illustrates a conventional 2-input TVD logic family and operation.
Figure 4:
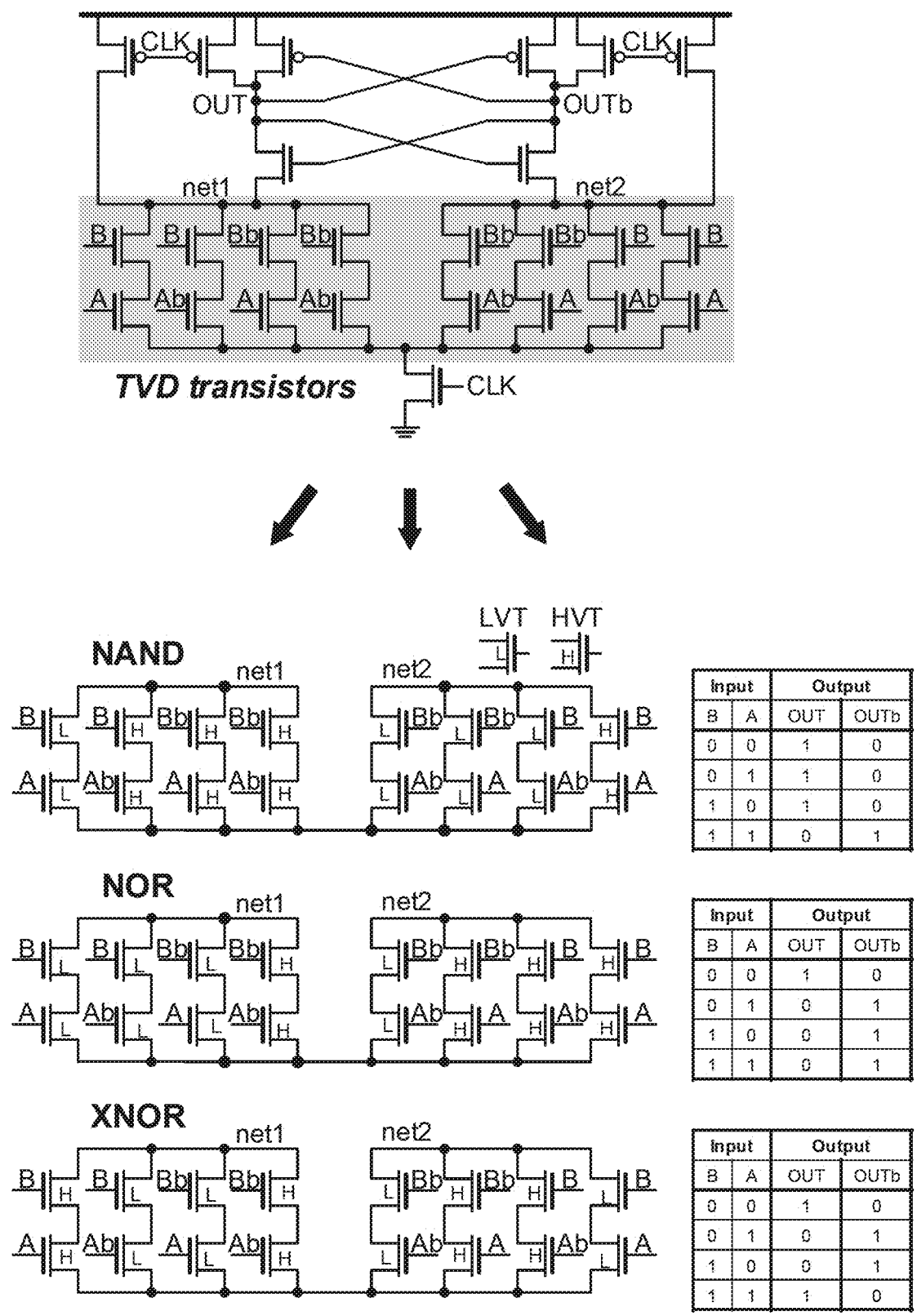
FIG. 4 illustrates a configuration of the TVD transistors for different Boolean functions (for a conventional TVD logic family).

In FIG. 3, for all combinations of inputs (Ab & Bb, A & Bb, Ab & B, A & B→four combinations in total), two series connected transistors exist from both net1 and net2 to net3. When the clock signal, CLK, is low (0), the output node OUT and OUTb are both precharged to supply voltage, VDD, regardless of the input combination. Depending on the input combination, only one of the paths from net1 and net2 to net3 will be turned on and once CLK goes high (VDD), the output nodes latch to either high or low (if OUT goes high, OUTb goes low and vice versa) depending on the current conduction between net1 and net2 to net3. The current conduction between net1 and net2 to net3 differs depending on the TVD transistors which is shown as the shaded part in FIG. 4. Simply changing the TVD transistors while using the same circuit (structure fixed, type of TVD transistors changed) enable the circuit to operate for different Boolean functions and thus prevents reverse engineering to reveal the function (e.g., through reverse engineering, it cannot be known whether a certain transistor is LVT, SVT, or HVT). In the figure and the figures that follow, an LVT transistor may be marked with an "L" and a HVT transistor may be marked with an "H."

For a conventional TVD logic family, different $V_T$ (threshold voltage) transistors such as low $V_T$ transistor (LVT) ($V_T \sim 300$ mV), standard $V_T$ transistor (SVT) ($V_T \sim 500$ mV), and high $V_T$ transistor (HVT) ($V_T \sim 600$ mV) conduct different amount of currents. With the same size of transistors, the magnitude of the current conductance between these devices is in the order of $I_L$ (LVT)$>I_S$ (SVT)$>I_H$ (HVT). Using such a characteristic, different Boolean functions such as NAND, NOR, and XNOR are implemented using the same circuit.

Figure 5A:
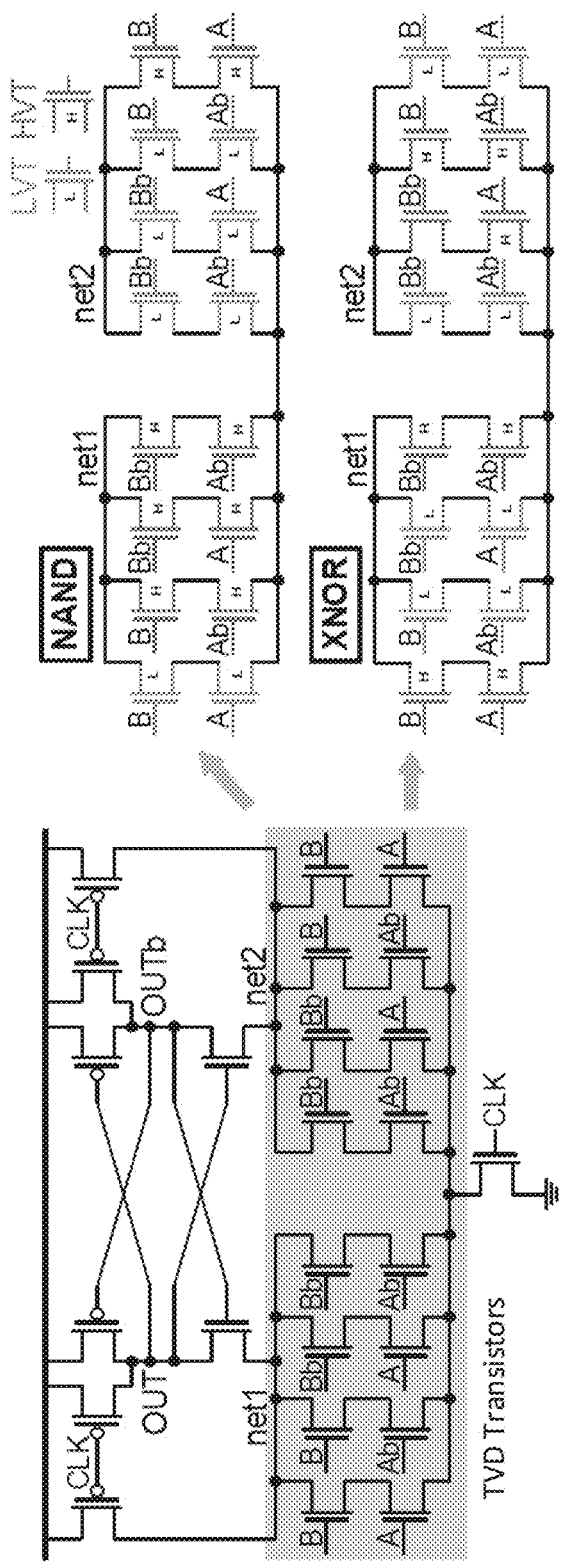
FIG. 5A illustrates a 2-input TVD logic gate and NAND & XNOR gate examples for a conventional TVD logic family.
Figure 5B:
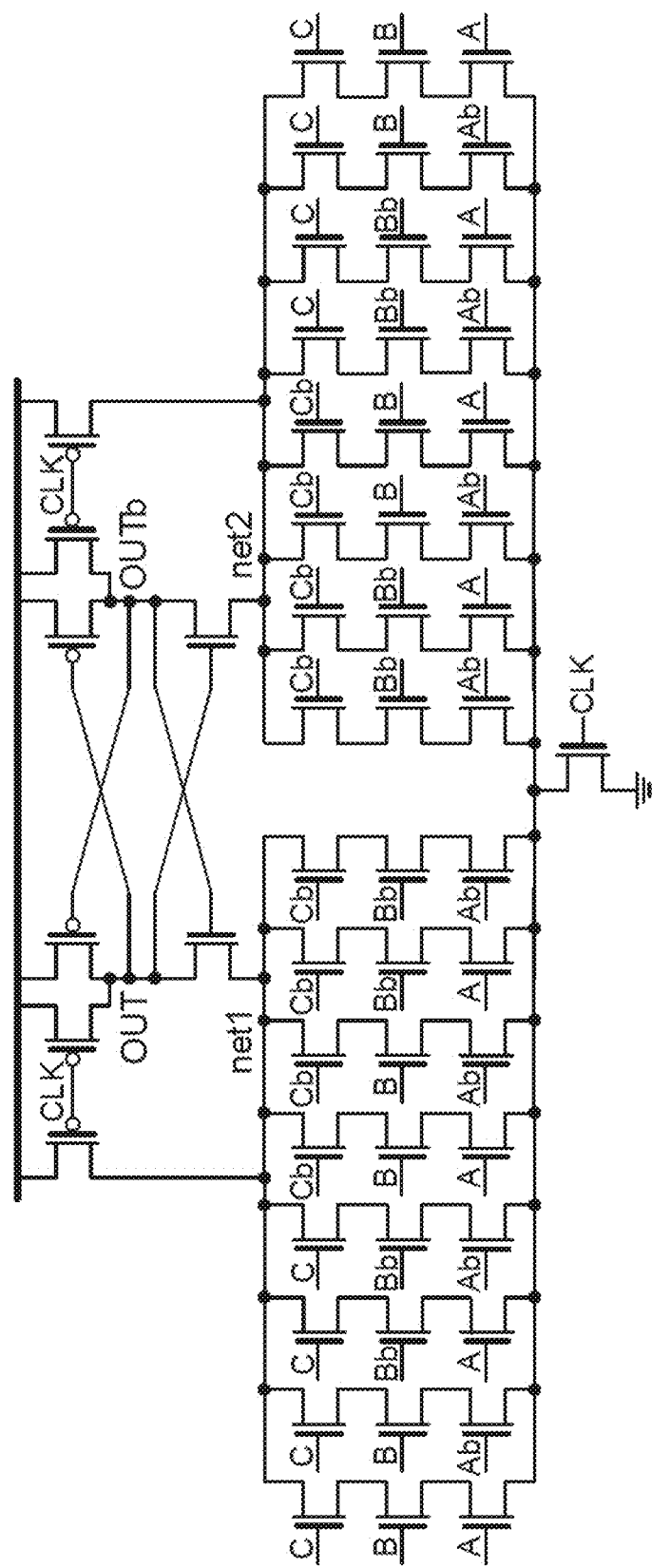
FIG. 5B illustrates a 3-input TVD logic gate fora conventional TVD logic family.

FIGS. 5A-5B show the TVD logic family presented in a paper by Erbagci, et al. See B. Erbagci, C. Erbagci, N. Akkaya, and K. Mai, "A secure camouflaged threshold voltage defined logic family," IEEE International Symposium on Hardware Oriented Security and Trust, McLean, Va., USA, May 2016, pp. 229-235. The input pair of a sense amplifier is replaced with pull-down transistors consisting of all possibilities of the input combination in parallel. Depending on the input, only one of the parallel paths from both the differential sides are turned on. By using asymmetric $V_T$ devices for a certain input combination, the current pulled by one of the differential sides is larger than the other which forces the sense amplifier to pull the output (OUT or OUTb) low for the side with larger current. Examples of NAND, NOR, and XNOR gate implementation is shown in FIG. 5A. Although this TVD logic family is robust to process-voltage-temperature (PVT) variation and creates the necessary obfuscation to protect from reverse engineering, the number of TVD transistors and transistors in stack increase significantly with the increase of inputs as shown in FIG. 5B for a 3-input logic gate. With N number of inputs, $2N \times 2^N$ TVD transistors along with N-stacked TVD transistors is required. In addition, the size of the preceding stage that drives the TVD logic correspondingly needs to increase as $2^N$ number of transistors act as the load.

Figure 6A:
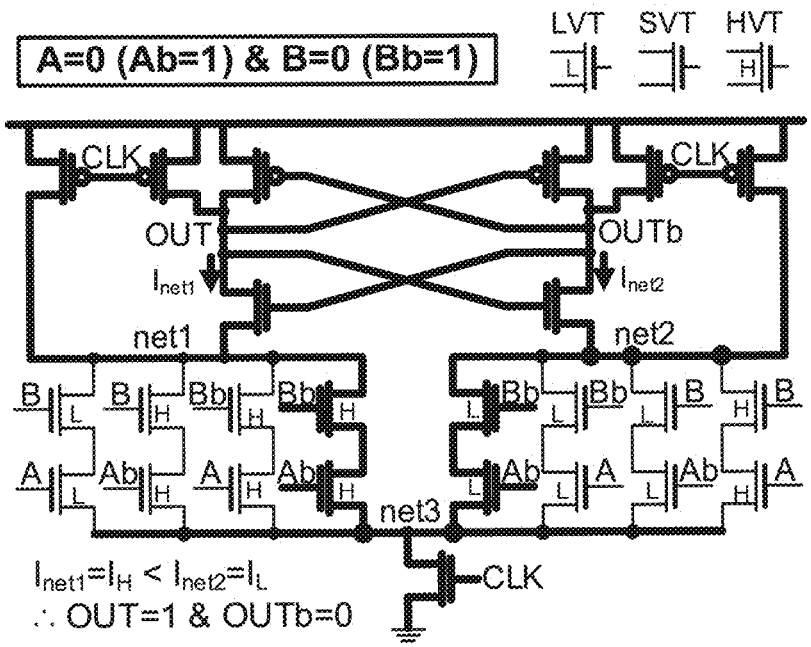
FIGS. 6A-6B illustrate turned on current paths depending on input combination for a NAND logic gate.
Figure 6A:
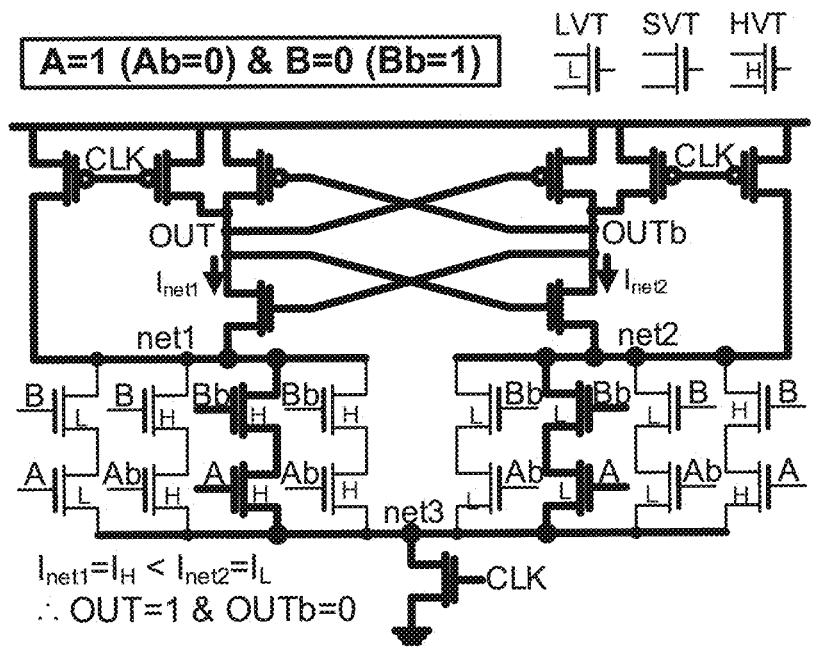
Figure 6B:
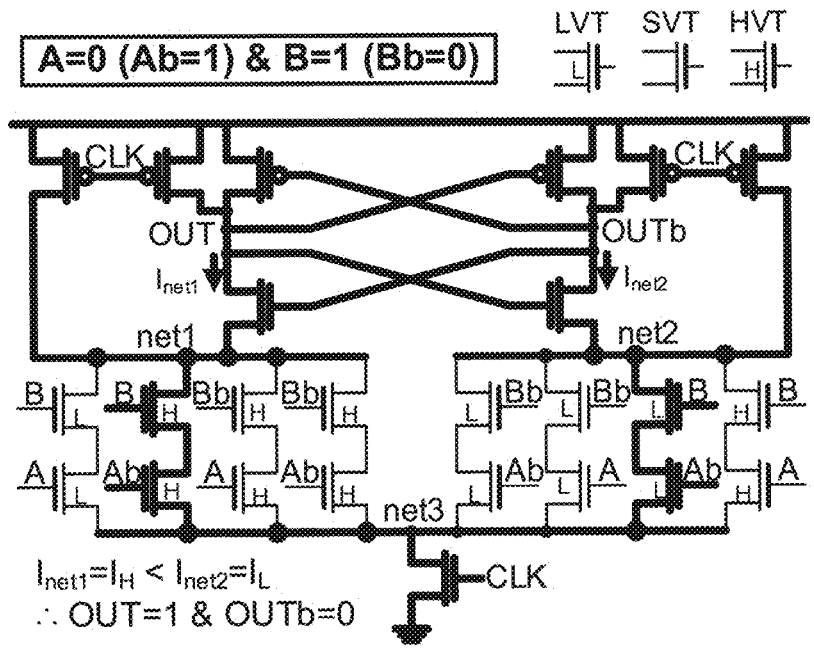
Figure 6B:
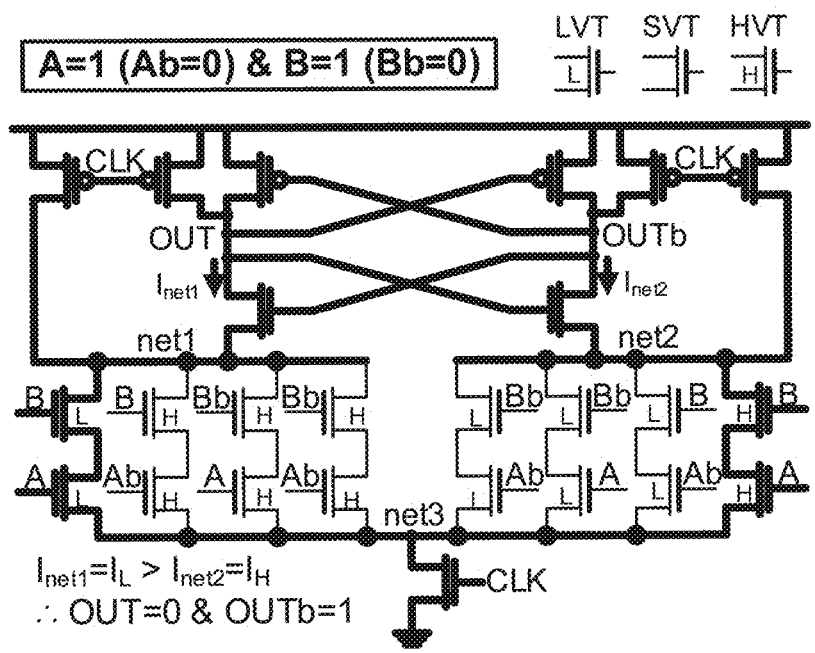
Figure 7A:
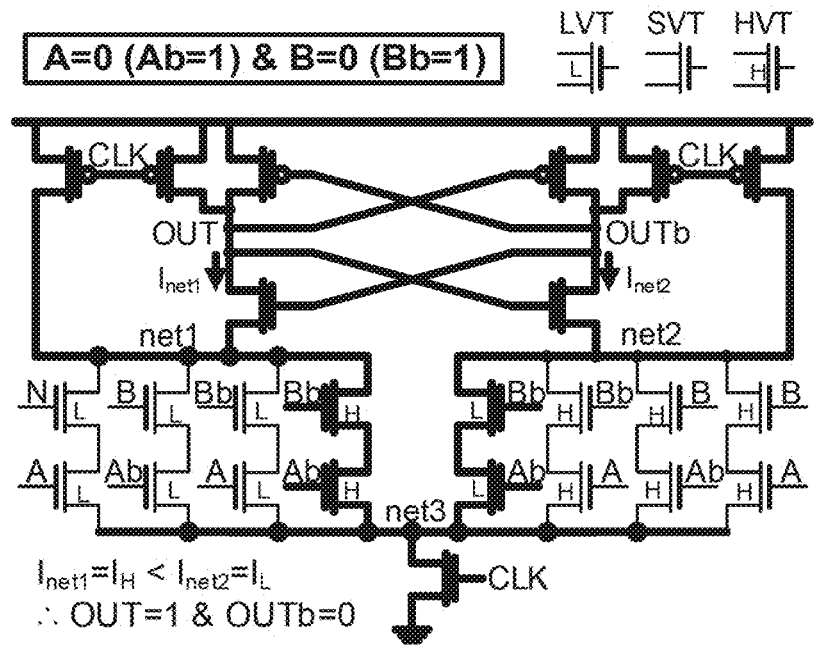
FIGS. 7A-7D illustrate conventional NOR and XNOR logic gate configuration depending on the input.
Figure 7A:
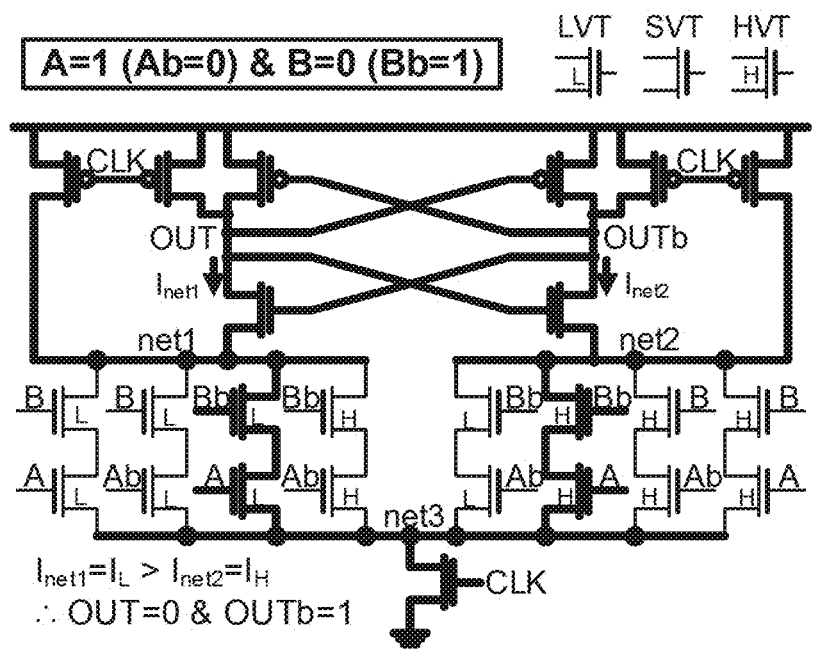
Figure 7B:
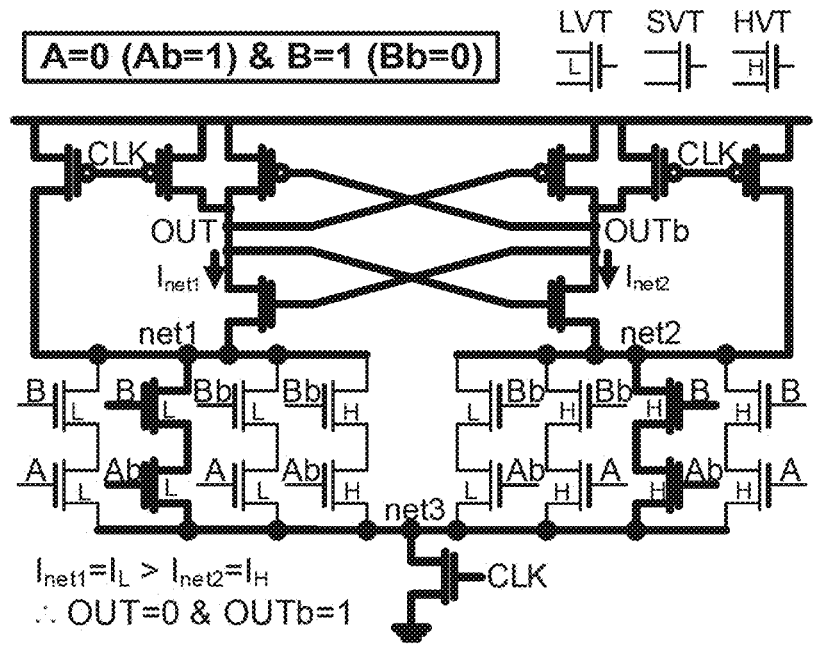
Figure 7B:
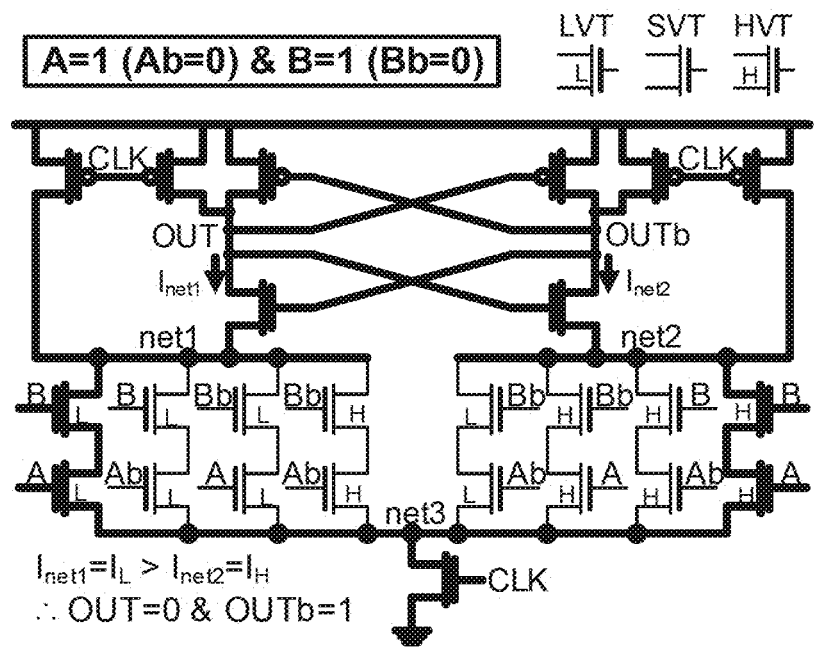
Figure 7C:
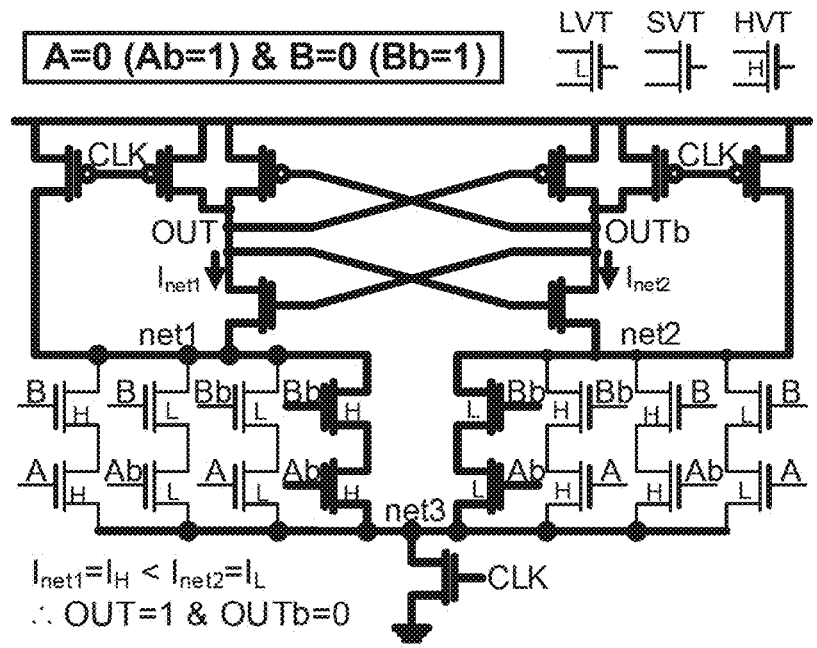
Figure 7C:
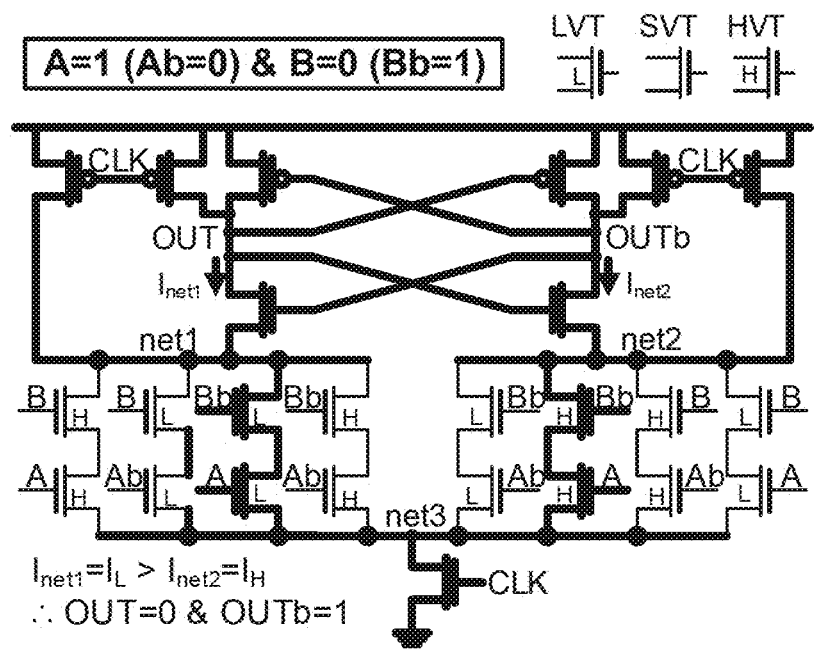
Figure 7D:
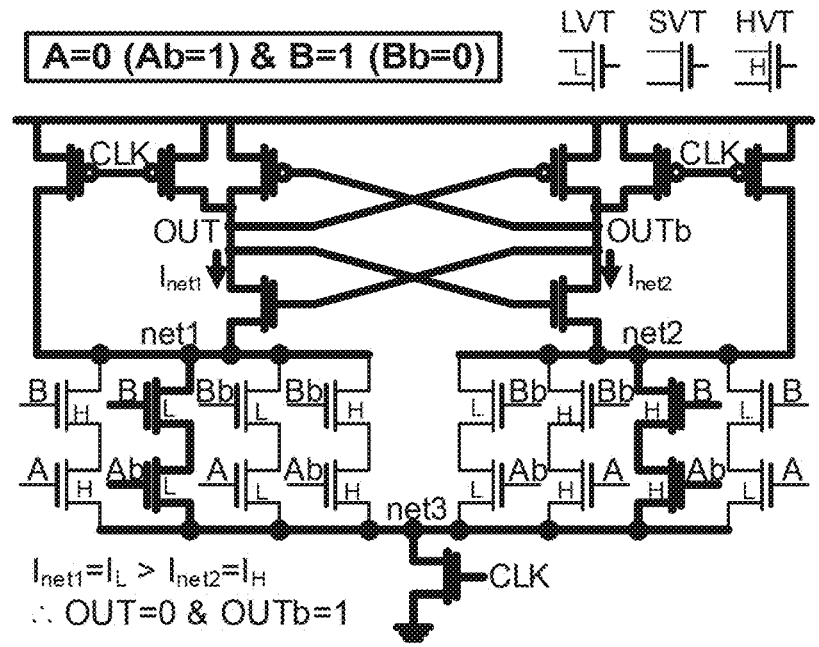
Figure 7D:
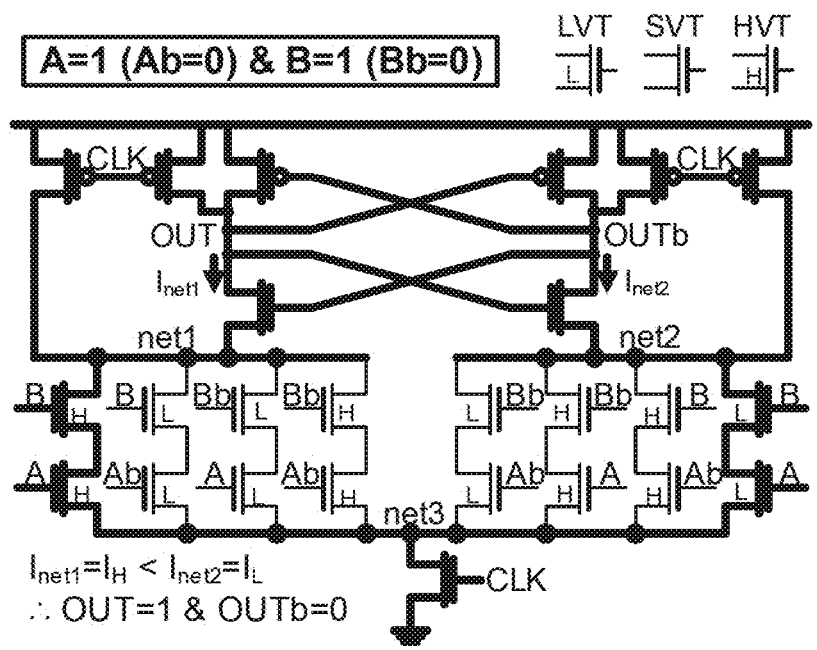

For an input combination of A=0 & B=0 as shown in FIGS. 6A-6B, the HVT transistors turn on from net1 to net3 and the LVT transistors turn on from net2 to net3 (as indicated by the bold lines in the figure(s)). Thus, the current comparison between net1 and net2, $I_{net1}$ and $I_{net2}$, is $I_{net1} < I_{net2}$ which will pull down the OUTb node to ground (0) and pull up the OUT node to VDD (1) when CLK signal is high. This goes for input combinations of A=1 & B=0 and A=0 & B=1 as well but for a combination of A=1 & B=1, the two series transistors from net1 to net3 are LVT transistors while net2 to net3 are HVT transistors leading to $I_{net1} > I_{net2}$ which makes OUTb go to VDD and OUT go to ground. The corresponding specified configurations for NOR and XNOR logic gates are shown in FIGS. 7A-7D.

Figure 8:
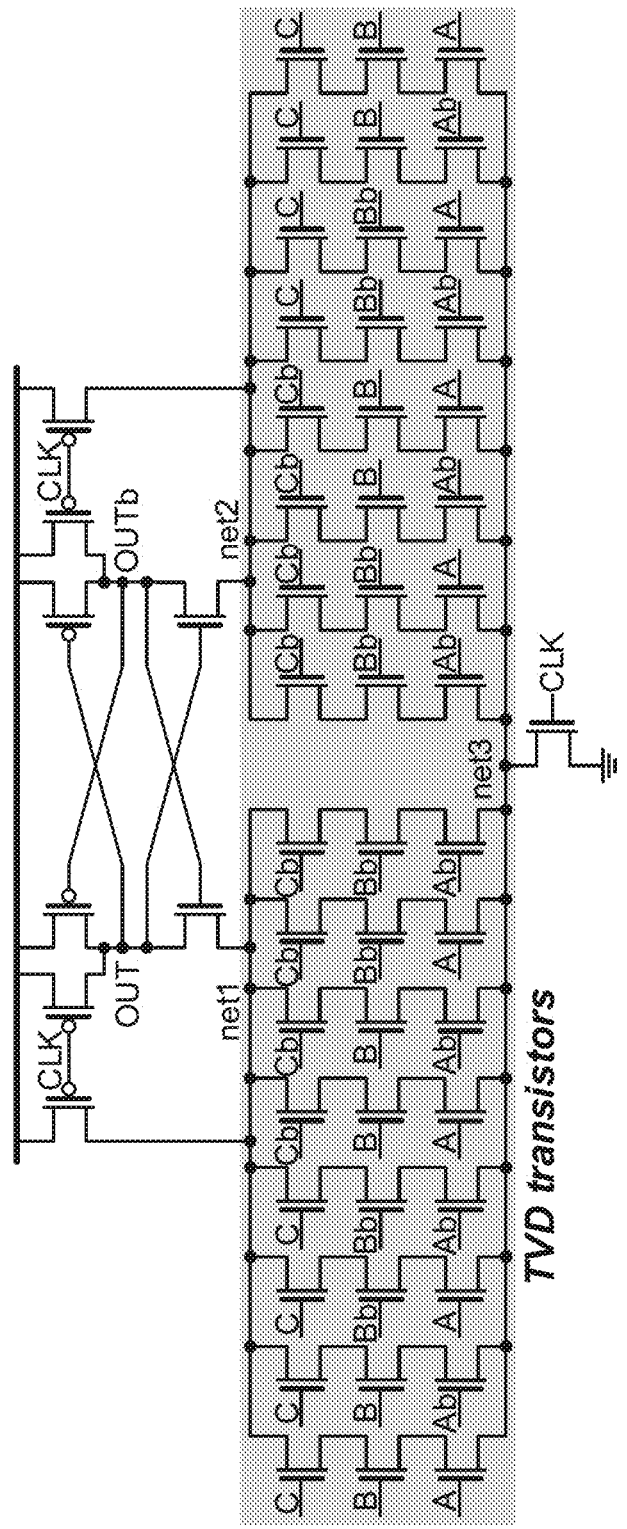
FIG. 8 illustrates a conventional 3-input TVD logic family.

Using two transistors in series for all the possible combinations from net1 and net2 to net3 indeed allows for all the possible conditions of operation to be covered. However, such approach increases the overall area/delay/power and becomes even more critical for larger input logic gates. The conventional 3-input TVD logic family is shown in FIG. 8, where it shows that 3 transistors need to be stacked for a single input combination while 8 parallel paths each are necessary from net1 and net2 to net3 to cover all the input combinations.

Figure 9A:
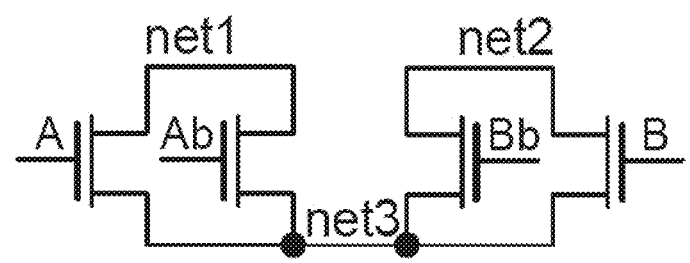
FIGS. 9A-9B shows a conversion of stacked to parallel TVD transistors for 2-input logic with (A) a parallel configuration of inputs A/Ab and B/Bb and (B) an added current path and XOR logic for proper operation of input combinations of 01 and 10 in accordance with various embodiments of the present disclosure.

Instead of simply stacking transistors and combining all possible combinations for a 2-input TVD logic, a unique parallel configuration is proposed. First, inputs A and B (and complementary signals Ab and Bb) are modified as the differential input pair of a sense amplifier as shown in FIG. 9A. Such a configuration allows only one of the transistors on each differential side to turn on for any input combination. Selecting the $V_T$ of the transistors to operate for certain input (AB) combinations such as 00 and 11 therefore could cause the logic to malfunction for input combinations of 01 and 10.

Figure 9B:
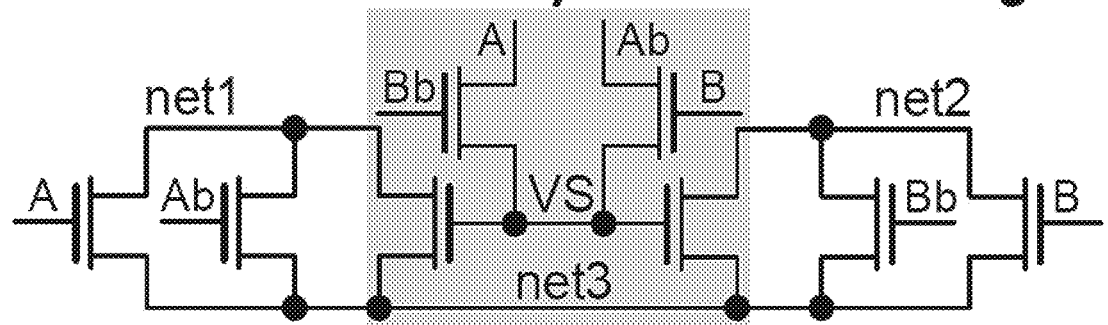

To resolve the issue, four transistors are added as shown in FIG. 9B, such that the transmission gate operates as a XOR logic to turn on the additional transistors for 01 and 10 input (AB) combinations. Consequently, for input (AB) combinations of 00 and 11, a single current path from each differential side determines the output while for 10 and 01, two current paths determine the output. The inclusion of the additional current path for 10 and 01 input combinations allows to cover any type of Boolean function with significantly reduced number of transistors while removing the stacked configuration.

An exemplary design with the proposed configuration is in the following order. First, the $V_T$ of the transistors with inputs of A/Ab and B/Bb are chosen depending on the Boolean function for input combinations of 00 and 11. Followingly, the $V_T$ of the additional current path transistor is selected for 10 and 01 input combinations. However, an incorrect initial selection of A/Ab and B/Bb $V_T$ transistors may not allow proper operation for 10 and 01 input combinations regardless of the type of $V_T$ transistors used for the additional current path. Thus, the $V_T$ of A/Ab and B/Bb transistors could require adjustment depending on the Boolean function. Accordingly, the present disclosure presents an enhanced threshold voltage defined (E-TVD) logic family that reduces the number of transistors used in the conventional design significantly. For example, the previous TVD transistors are shown in FIG. 9C and are changed as shown in FIG. 9D for an exemplary 2-input logic gate structure.

Here, in one embodiment, an exemplary 2-input configuration places one of the inputs and its complementary signal (A and Ab) between net1 and net3 and the other input and its complementary signal (B and Bb) between net2 and net3 as a parallel connection similar to the differential input pair of a typical sense-amplifier. One of the paths (from the two) from net1 and net2 to net3 will always be turned on depending on the input combination. With just 4 transistors, however, all input combinations cannot be covered and will malfunction for certain inputs.

As shown in the truth table of FIG. 10, if the TVD transistors are chosen to cover the input combination of "00" and "11", it will not function properly for input combinations of "01" and "10". Thus, for proper operation, an additional current path is added from net1 and net2 to net3 for the input combinations of "01" and "10".

Figure 11:
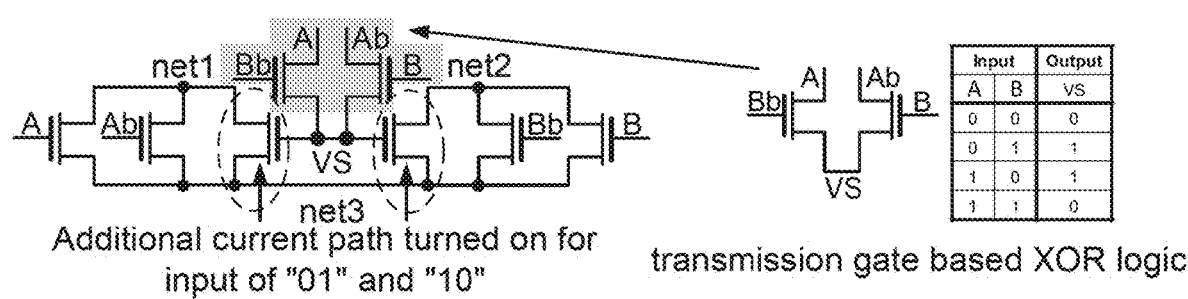
FIG. 11 illustrates exemplary enhanced-threshold voltage defined (E-TVD) logic gates with four transistors added for proper operation in one embodiment of the present disclosure.

The additional current path is outlined by the ellipses in FIG. 11. The gate of the additional current path, VS, is controlled by a transmission gate based 2-input XOR logic as shown on the right of the figure. The transmission gate passes a "0" for input combination of "00" and "11" which turns off the additional current path while for "01" and "10" input combination passes a "1" and turns on the additional current path. The four added transistors in total enables the circuit to function properly for any Boolean function.

Figure 12A:
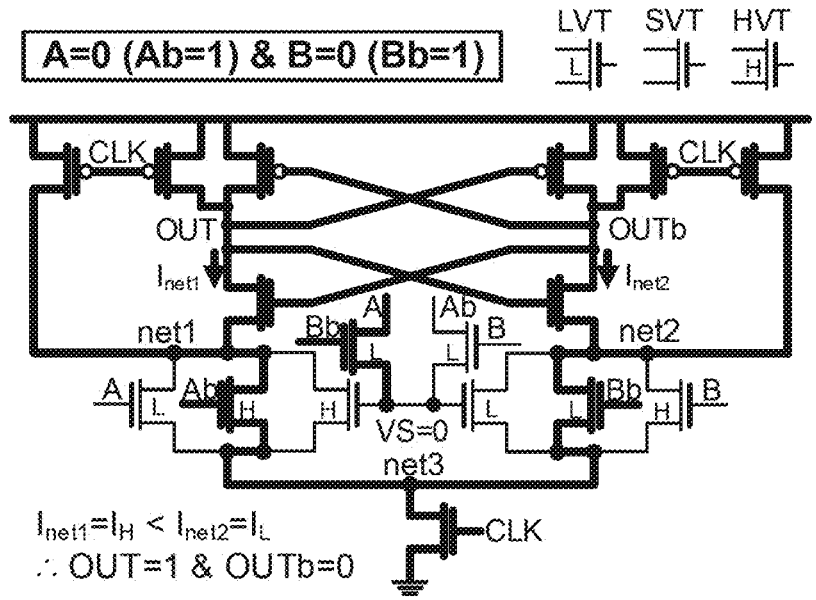
FIGS. 12A-12B illustrate turned on current paths depending on input combination for NAND logic gate in accordance with embodiments of the present disclosure.
Figure 12A:
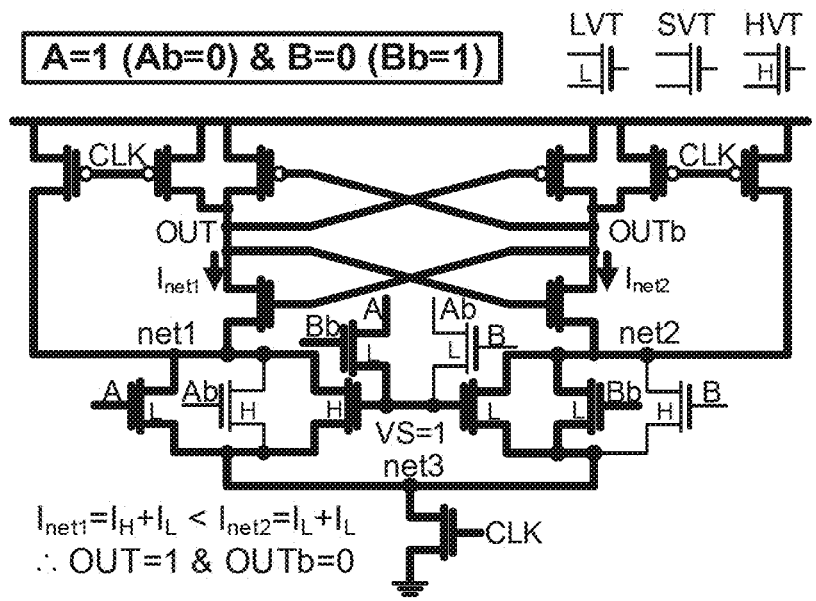
Figure 12B:
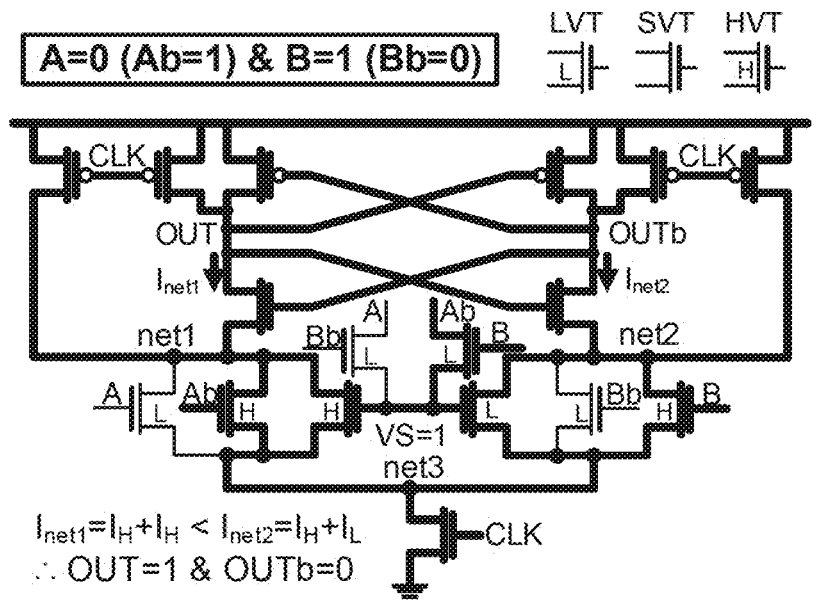
Figure 12B:
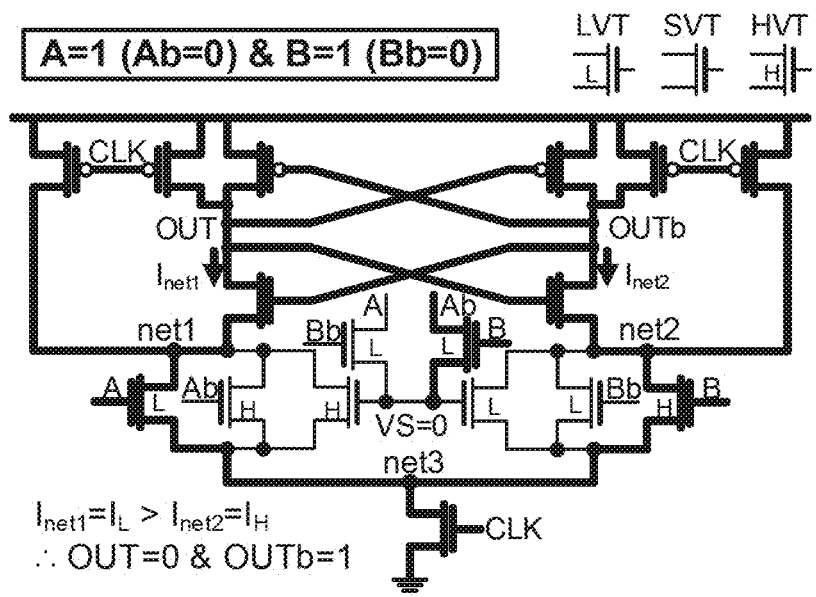
Figure 13:
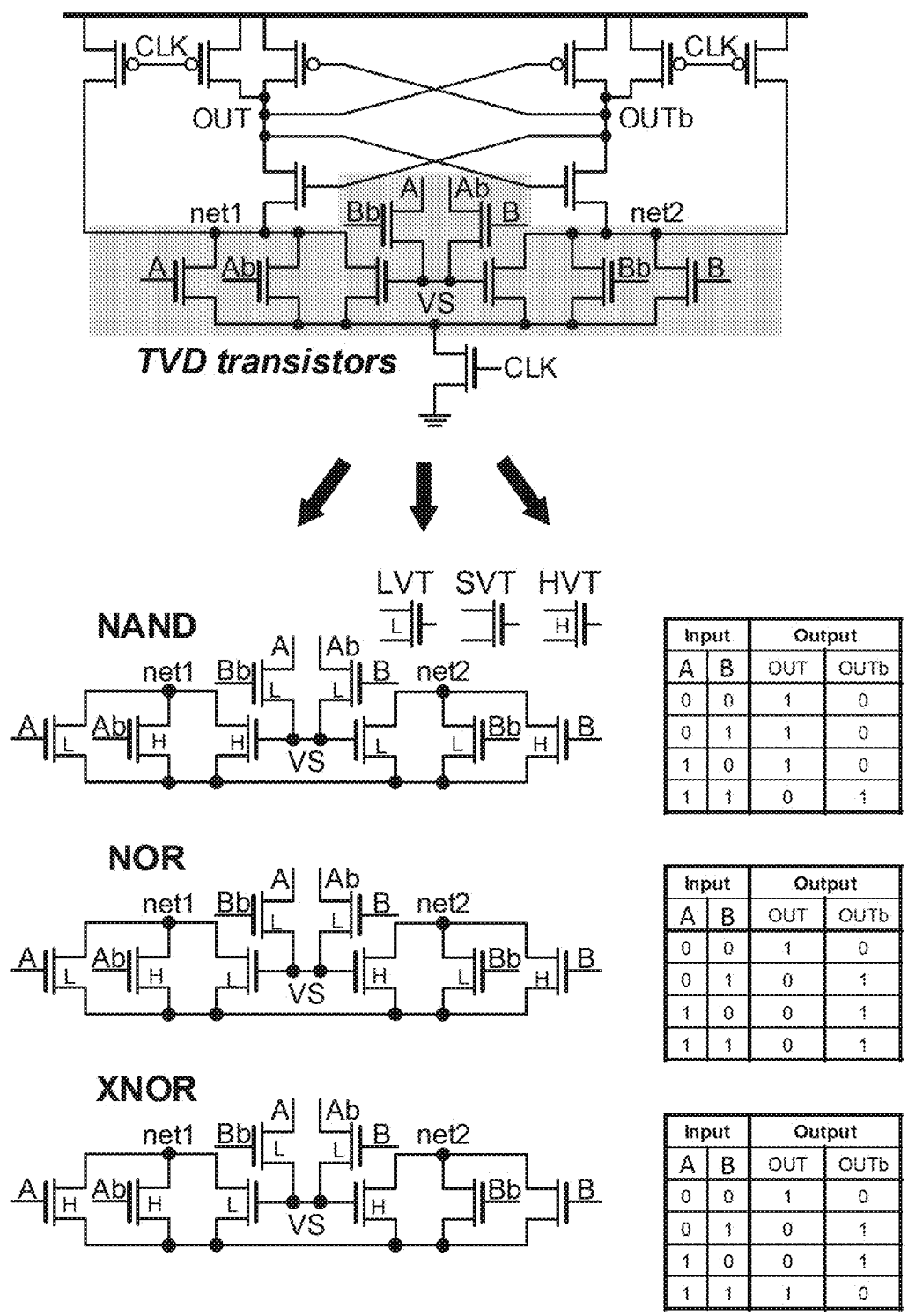
FIG. 13 illustrates a configuration of the E-TVD transistors for different Boolean functions in accordance with embodiments of the present disclosure.
Figure 14A:
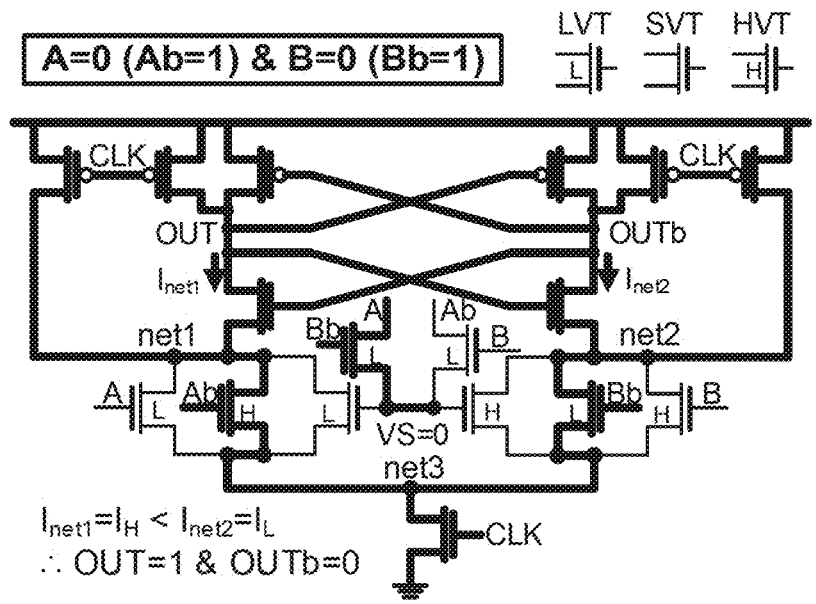
FIGS. 14A-14D illustrate NOR and XNOR logic gate configuration depending on the input in accordance with embodiments of the present disclosure.
Figure 14A:
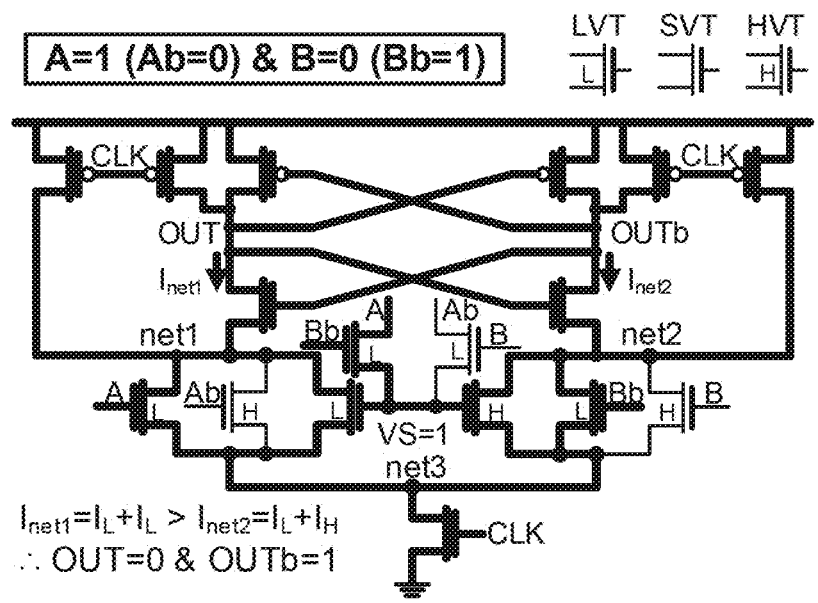
Figure 14B:
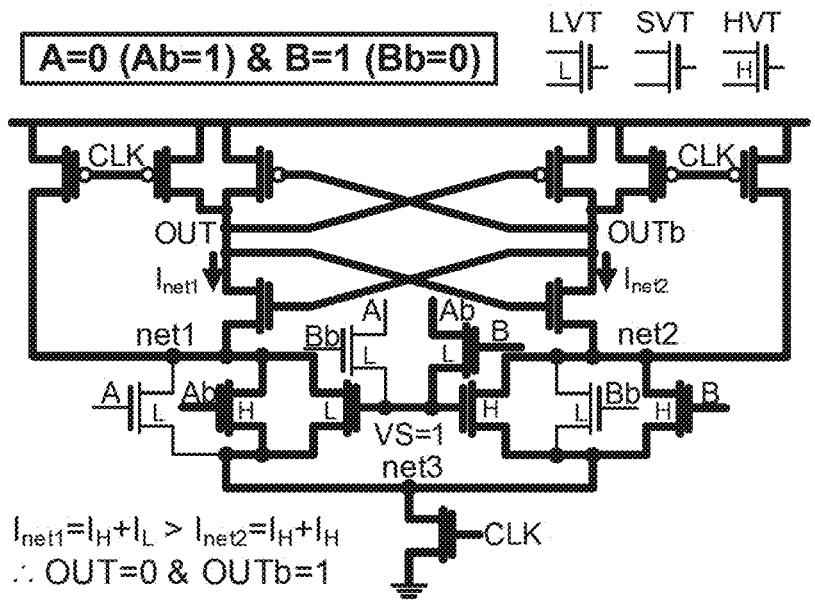
Figure 14B:
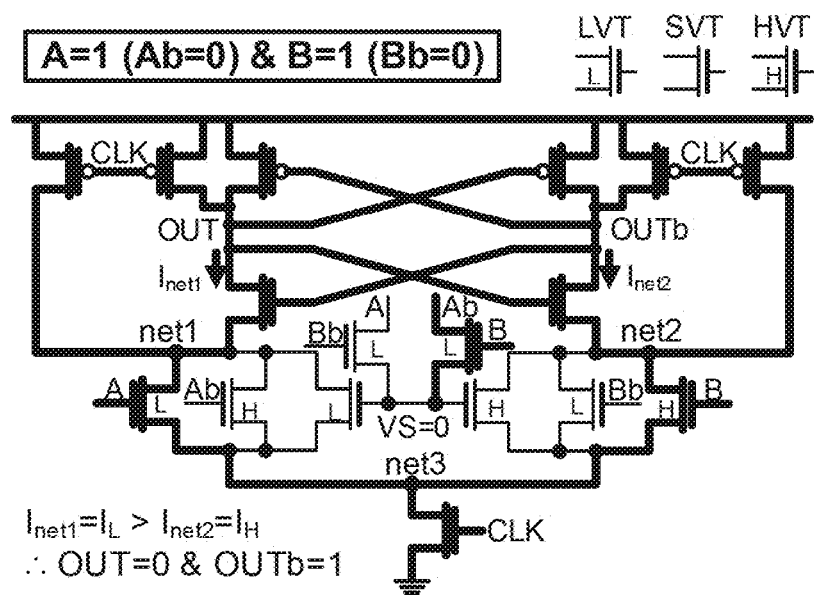
Figure 14C:
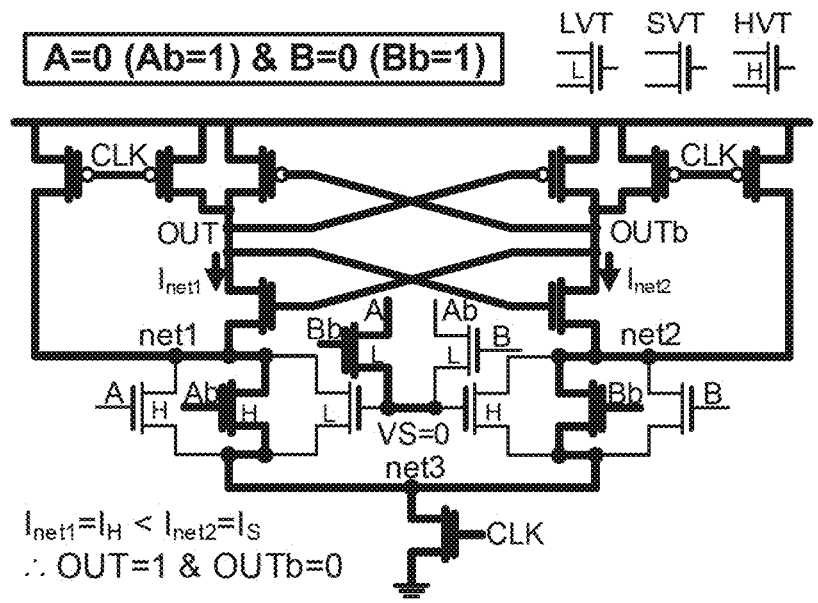
Figure 14C:
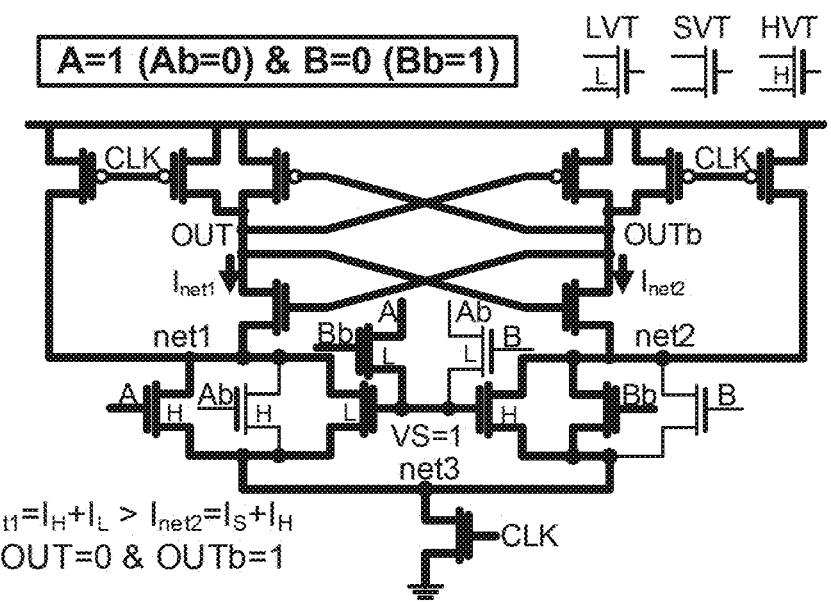
Figure 14D:
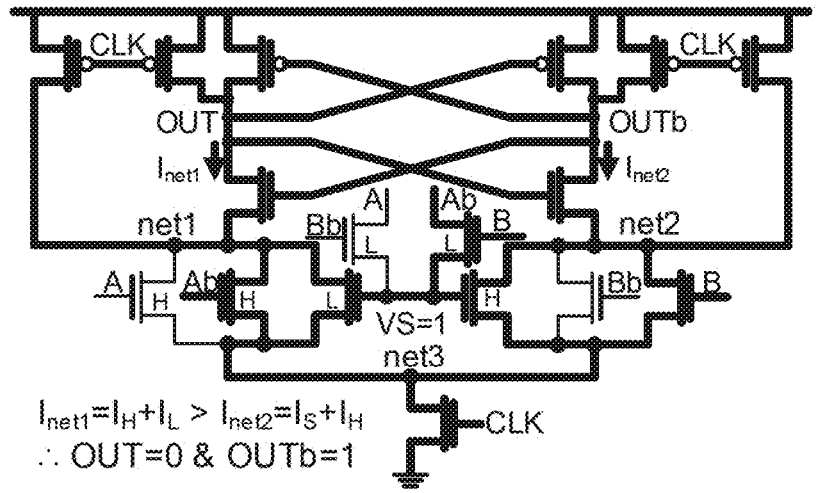
Figure 14D:
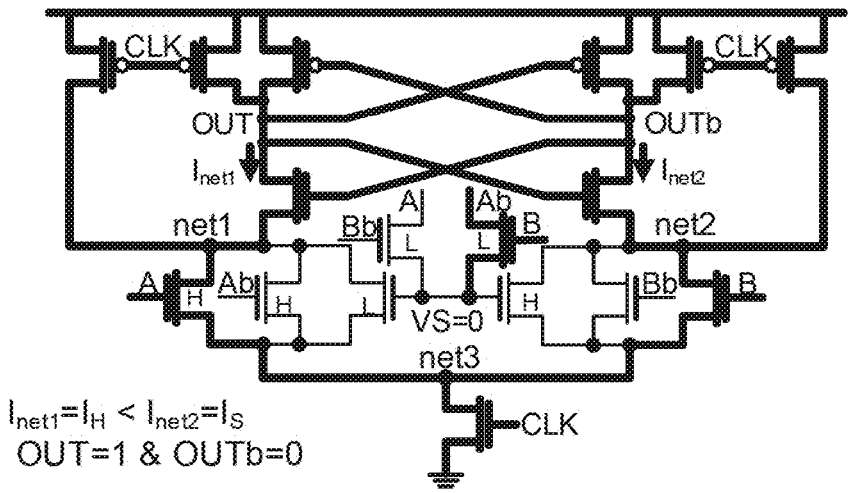

The basic timing is the same as the conventional TVD logic family. A specified illustration of the 2-input NAND logic gate is shown in FIGS. 12A-12B. Additionally, FIG. 13 illustrates a configuration of the E-TVD transistors for different Boolean functions in accordance with embodiments of the present disclosure.

For an input combination of A=0 & B=0 as shown in FIG. 12A, the HVT transistor path is turned on from net1 to net3 and the LVT transistor path is turned on from net2 to net3. Thus, the current comparison between net1 and net2, $I_{net1}$ and $I_{net2}$, is $I_{net1} < I_{net2}$ which will pull down the OUTb node to ground (0) and pull up the OUT node to VDD (1) when CLK signal is high. For an input combination of A=1 & B=1, the LVT transistor path is turned on from net1 to net3 and the HVT transistor path is turned on from net2 to net3 which pulls up the OUTb node to VDD (1) and pulls down the OUT node to ground (0) when CLK signal is high. For these inputs, VS=0 and the additional current paths are turned off.

Without the additional current path for an input combination of A=0 & B=1, the same HVT path will be connected between net1 and net2 to net3 which will cause a malfunction (metastable state). For an input combination of A=1 & B=0, the same LVT path will be connected between net1 and net2 to net3 which will cause a malfunction as well.

However, the additional current path enables for proper operation depending on the conducted current. For A=0 & B=1, an additional HVT transistor will be turned on between net1 to net3 and the two currents will add up to be $I_{net1}=2I_H$. An additional LVT transistor will be turned on between net1 to net3 and $I_{net2}=I_L+I_H$. Thus $I_{net1} < I_{net2}$, and OUTb will be pulled down to 0 and OUT will be pulled up to 1. For A=1 & B=0, one LVT and one HVT will be turned on between net1 to net3 and the two currents will add up to be $I_{net1}=I_L+I_H$. Two LVT will be turned on between net1 to net3 and $I_{net2}=2I_L$. Thus $I_{net1} < I_{net2}$, and OUTb will be pulled down to 0 and OUT will be pulled up to 1. Corresponding specified configurations for NOR and XNOR logic gates are shown in FIGS. 14A-14D.

Figure 15:
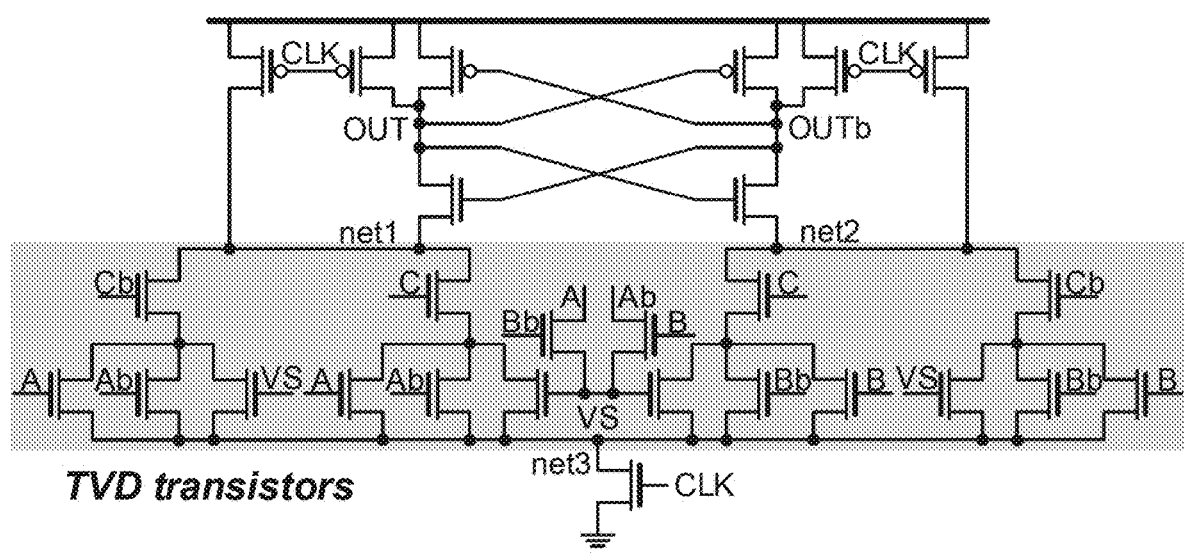
FIG. 15 illustrates an exemplary 3-input E-TVD logic family in accordance with embodiments of the present disclosure.

The differential input configuration using a parallel connection along with the additional current path allows the circuit to function properly for different Boolean functions. Other Boolean functions rather than NAND, NOR and XNOR can be built in the same manner. An exemplary method for one embodiment of the present disclosure reduces the number of transistors significantly compared to a conventional TVD logic family, which becomes more significant with the increase in the number of inputs. A 3-input E-TVD logic family is shown in FIG. 15 for example. The third input C (and complementary signal Cb) of the 3-input logic gate properly chooses the path for comparison. The inputs A and B are configured in the same manner as before.

Figure 16A:
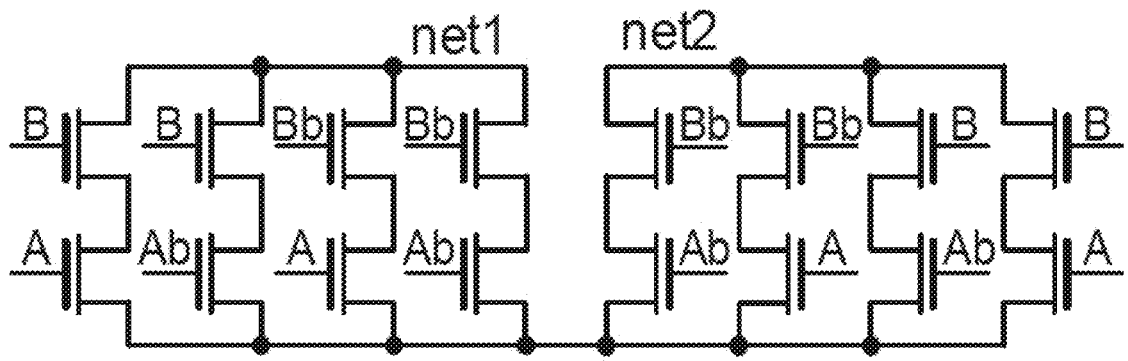
FIGS. 16A-16B illustrate a conversion of stacked TVD transistors to parallel TVD transistors for 2-input TVD logic for a conventional 2-input TVD logic configuration and an exemplary 2-input TVD logic configuration in accordance with embodiments of the present disclosure.
Figure 16B:
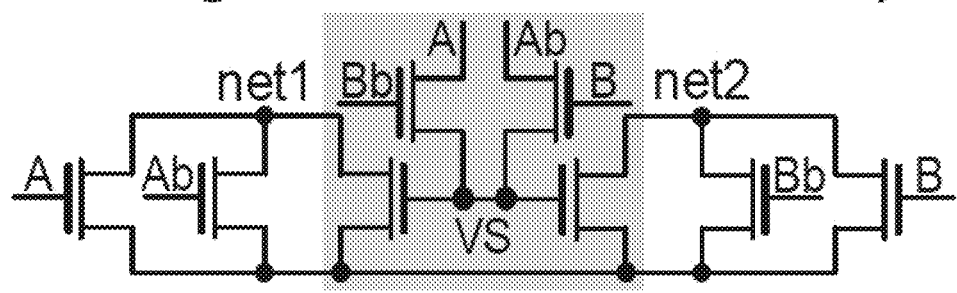

In brief, instead of simply stacking NMOS transistors and combining all possible combinations in parallel for a 2-input TVD logic, as shown in FIG. 16A, a parallel configuration approach is used in this design. As shown in FIG. 16B, each input, A and B (and complementary signals Ab and Bb), is used as a differential input pair of a sense amplifier. These transistors with different voltage thresholds ($V_T$) contribute in determining an output for the input of 00 and 11. To properly determine the output for an 01 and 10 input, an additional current path with a different $V_T$ is necessary to satisfy a different type of Boolean function. The transmission gate in the shaded part of FIG. 16B, operates as an XOR gate to turn on the additional current path for 01 and 10 input (as indicated by the bold lines in the figure(s)). The inclusion of the current path and the XOR transmission gate by using 4 NMOS transistors allows for reduction of the number of transistors significantly while removing the stacked configuration.

Figure 17A:
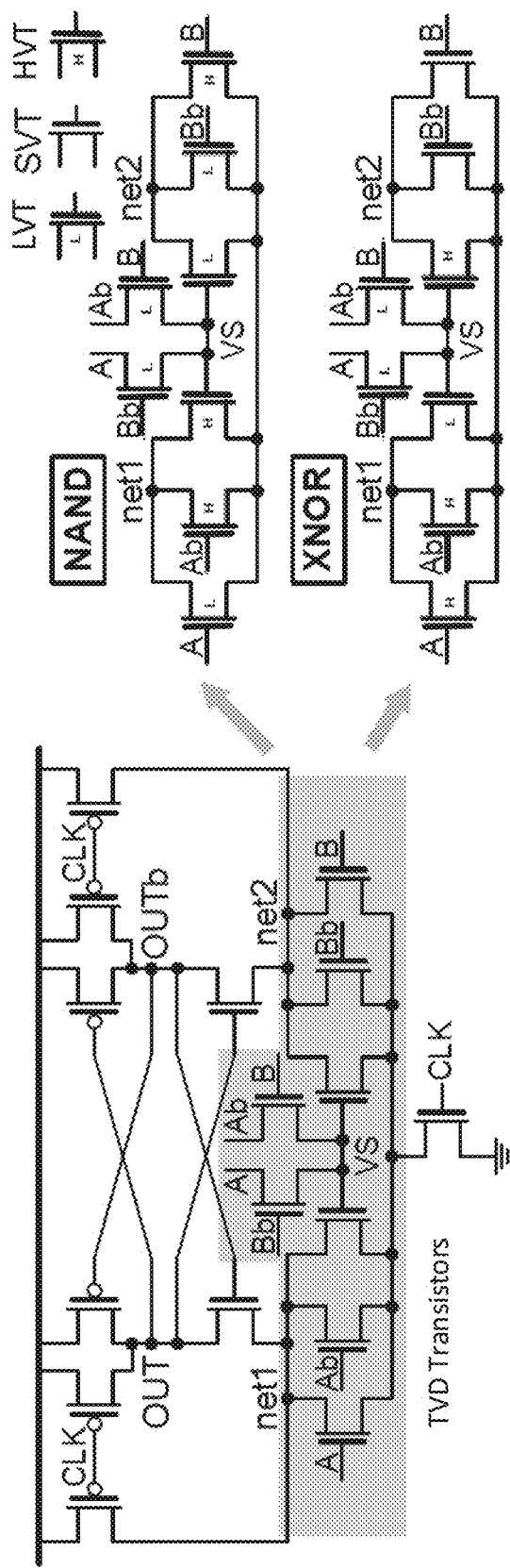
FIGS. 17A-17B illustrate an exemplary enhanced TVD logic family fora 2-input E-TVD logic gate (and NAND & XNOR gate examples) and an XNOR gate output depending on an input combination in accordance with embodiments of the present disclosure.
Figure 17B:
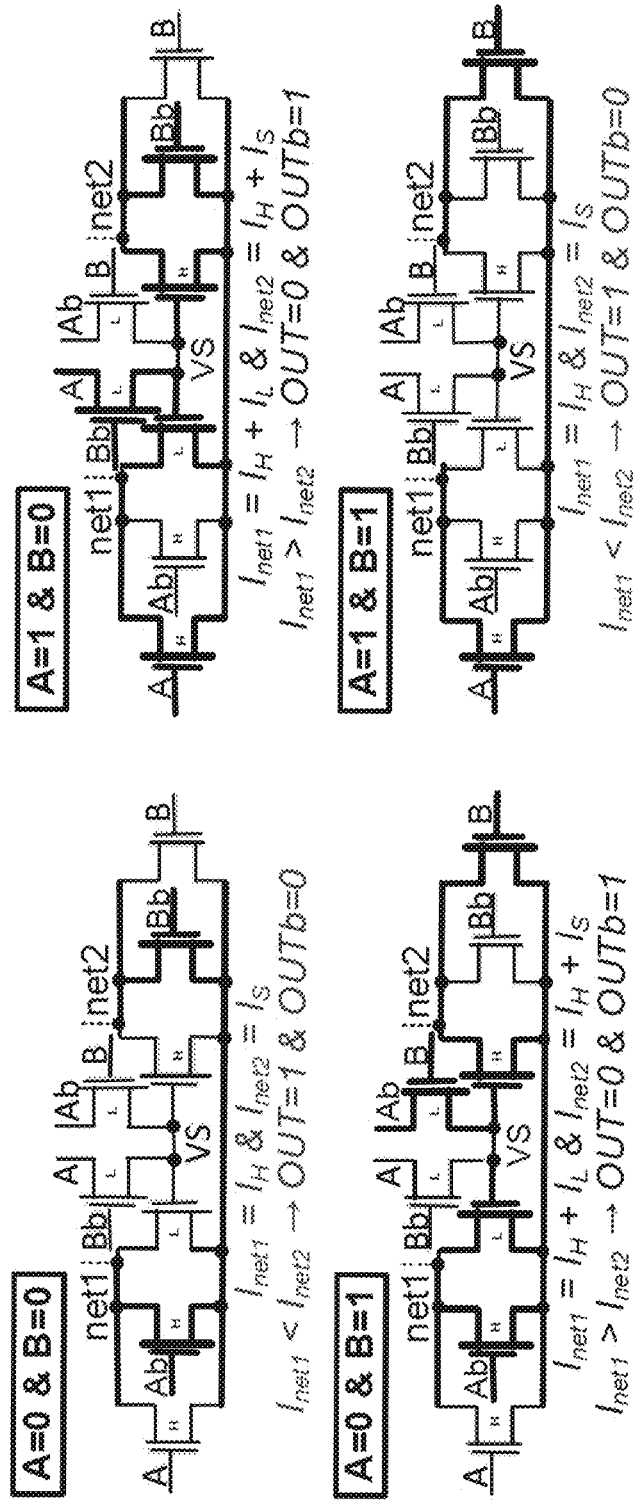

The enhanced TVD (E-TVD) logic family using the parallel configuration approach is shown in FIGS. 17A-17B. The required number of TVD transistors is halved for the enhanced 2-input TVD logic gate. Examples of the $V_T$ implant for NAND and XNOR gate implementation is shown in FIG. 17A. Further description of the XNOR gate depending on the input is shown in FIG. 17B with detailed illustration of how the transistors operate. For the inputs of 00 and 11, current equal to $I_H$ and $I_L$ flow from net1 and net2 to ground, respectively. Net2 sinks more current compared to net1 and consequently node OUT goes high (1) and OUTb goes low (0). For the inputs of 01 and 10, the additional current paths turn on. Current equal to ($I_H+I_L$) and ($I_H+I_S$) flow from net1 and net2 to ground, respectively, and thus node OUT goes low and OUTb goes high.

Figure 18:
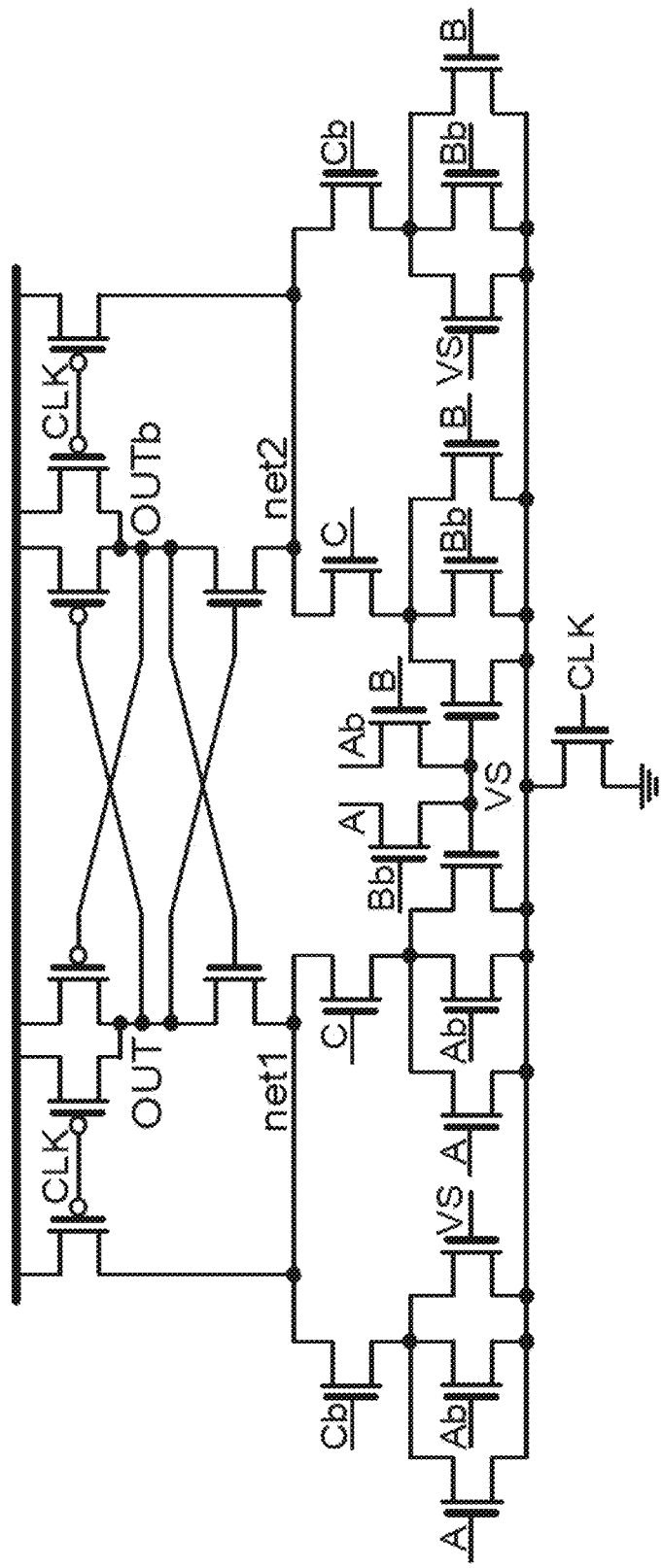
FIG. 18 illustrates an exemplary 3-input enhanced TVD logic family in accordance with embodiments of the present disclosure.

The 3-input E-TVD logic family is shown in FIG. 18. Due to the parallel configuration approach for two of the inputs, the total number of TVD transistors is significantly reduced compared to the conventional design shown in FIG. 5B. In addition, one less stacking is required and the number of parallel branches on both the node net1 and net2 is reduced as well, which substantially helps to minimize the power consumption.

Figure 19A:
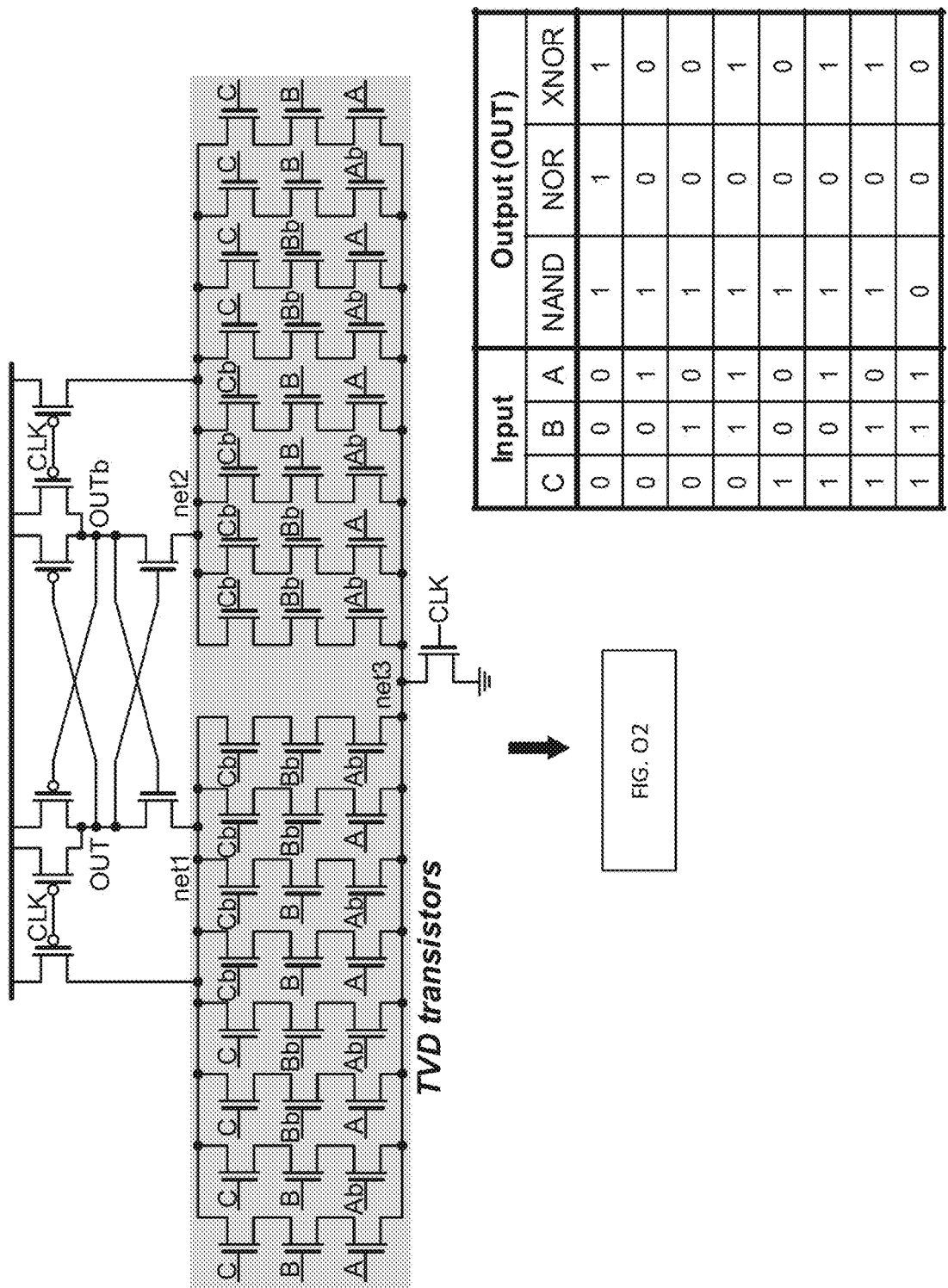
FIGS. 19A-19B illustrate a conventional configuration of the 3-input TVD transistors for different Boolean functions.
Figure 19B:
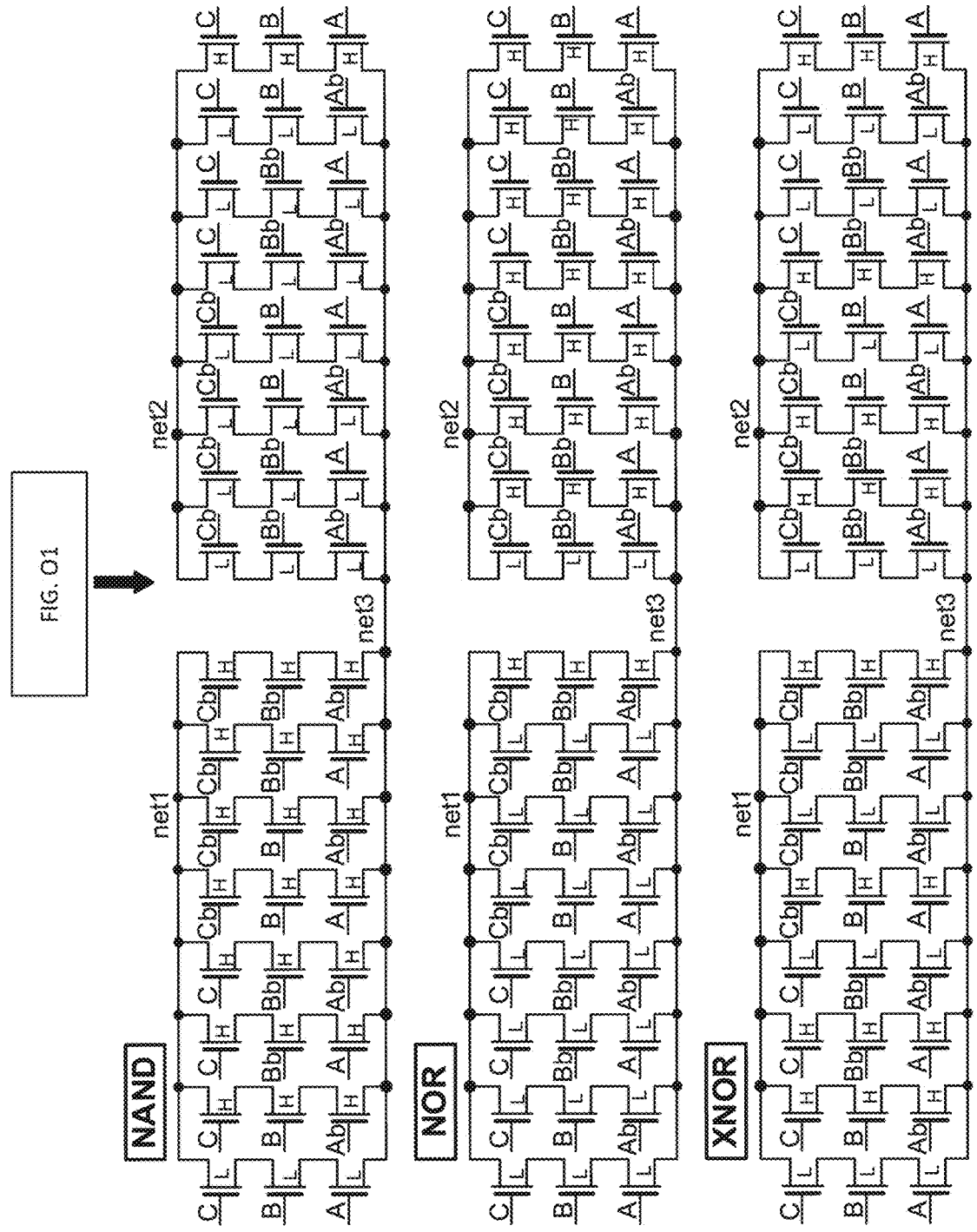
Figure 20A:
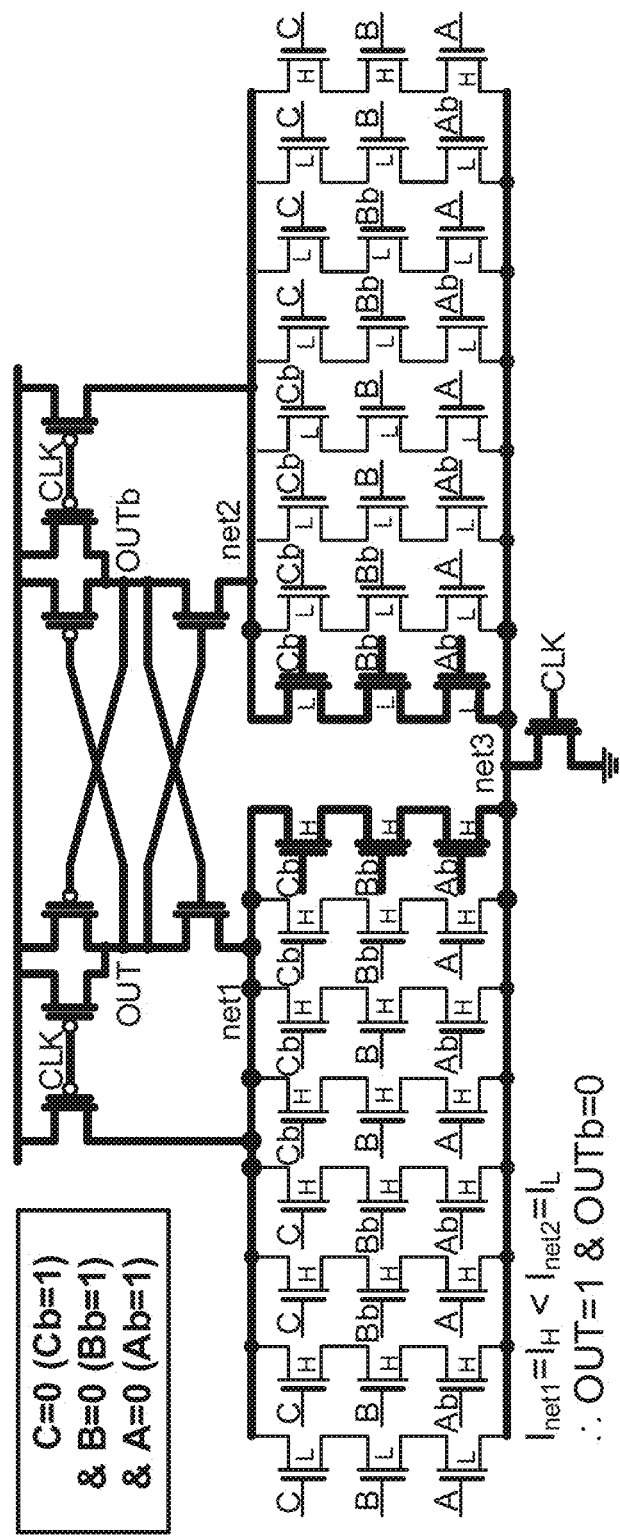
FIGS. 20A-20H illustrate turned on current paths of the 3-input TVD transistors of FIG. 19A depending on an input combination for an NAND logic gate.
Figure 20B:
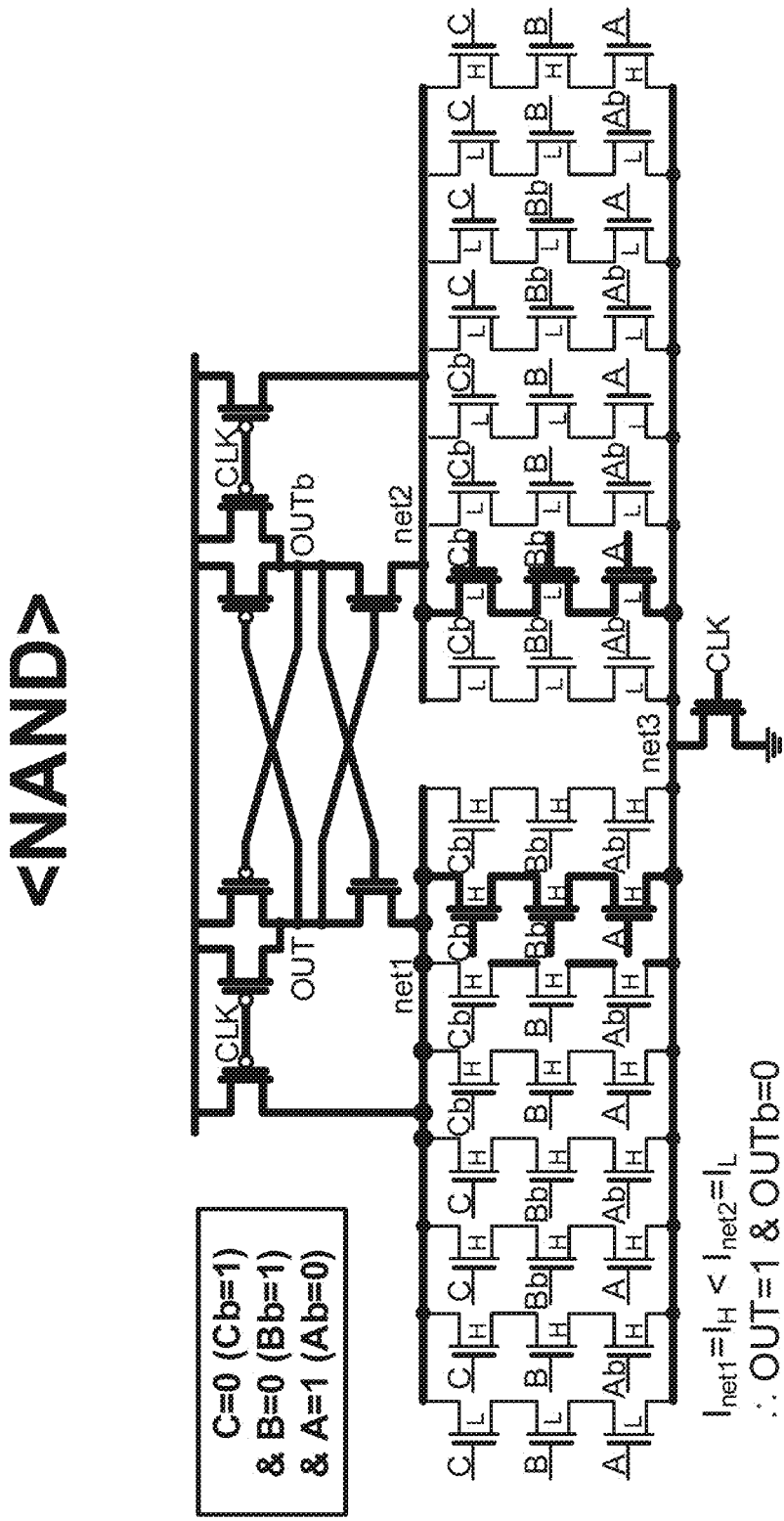
Figure 20C:
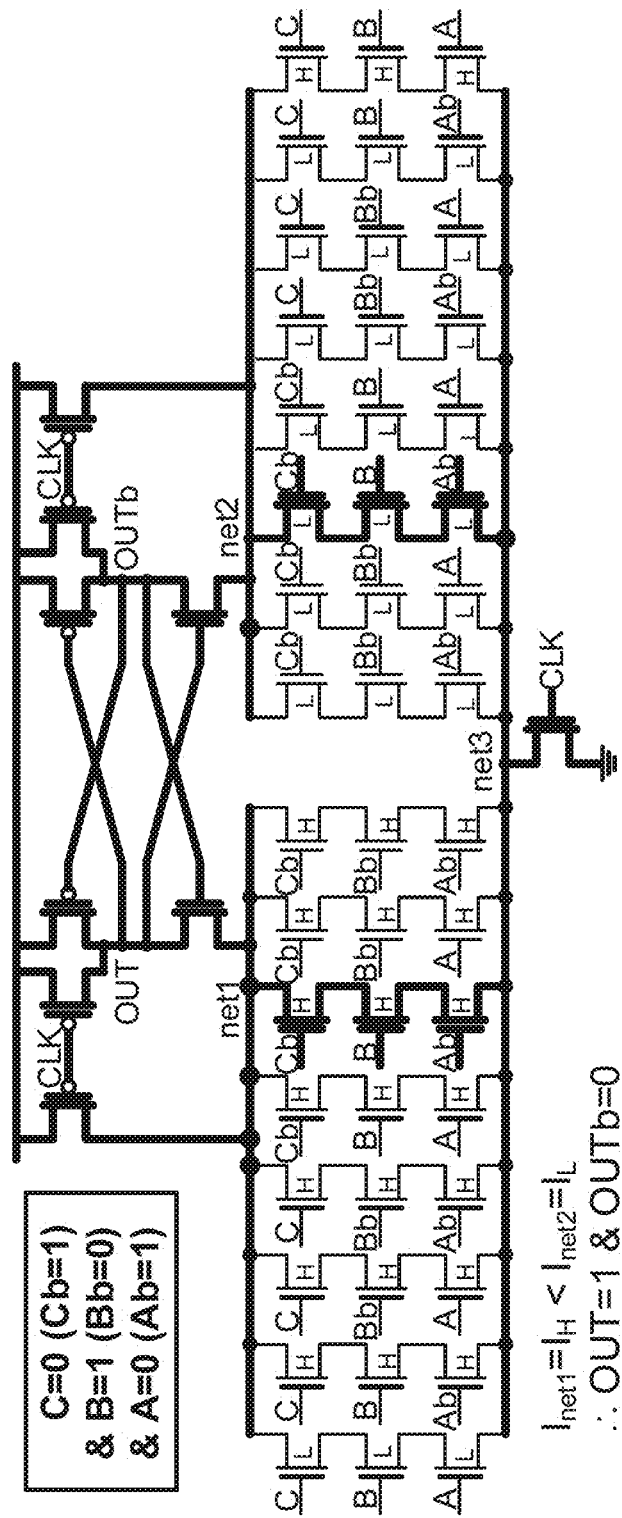
Figure 20D:
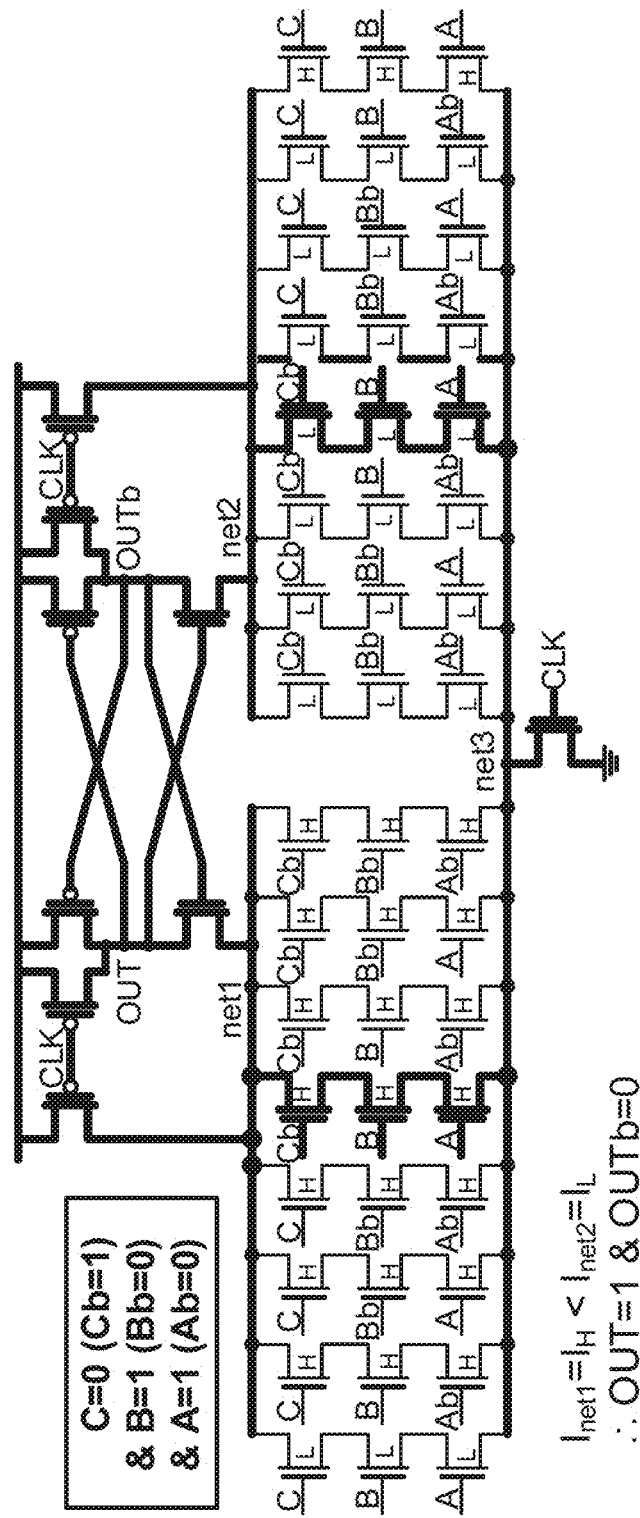
Figure 20E:
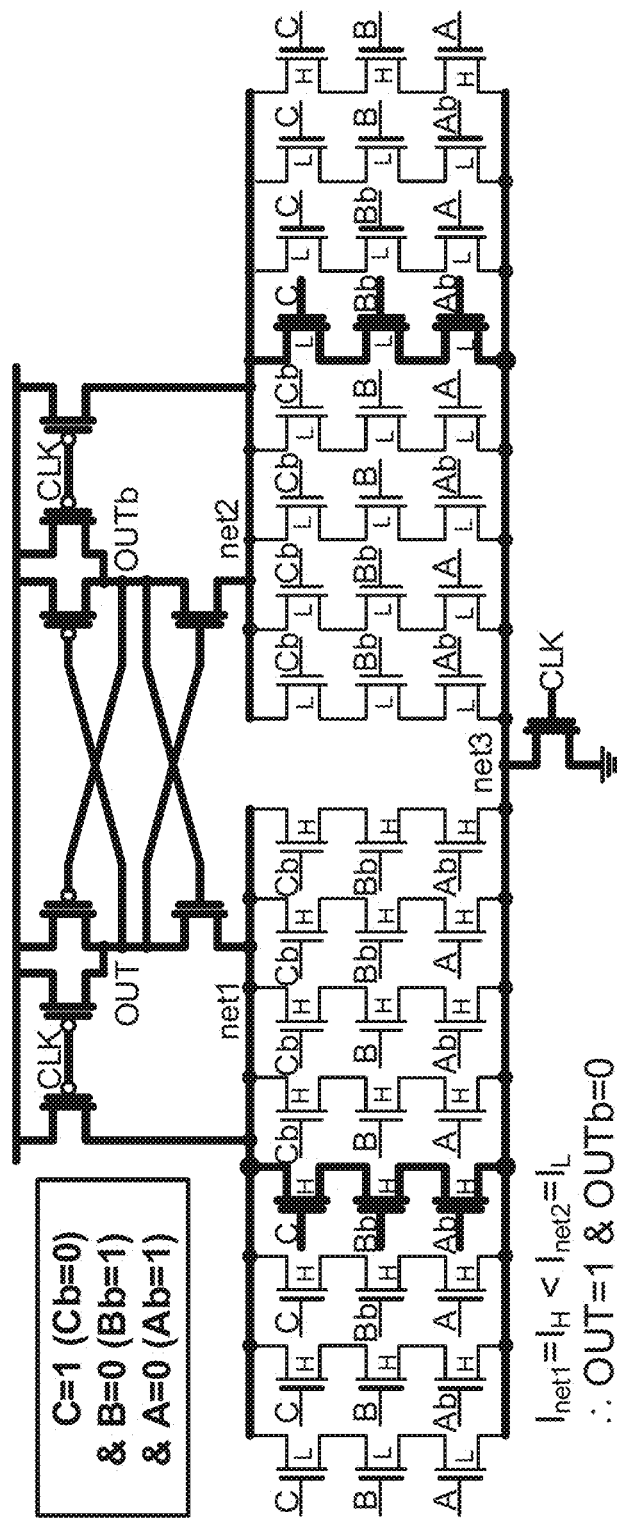
Figure 20F:
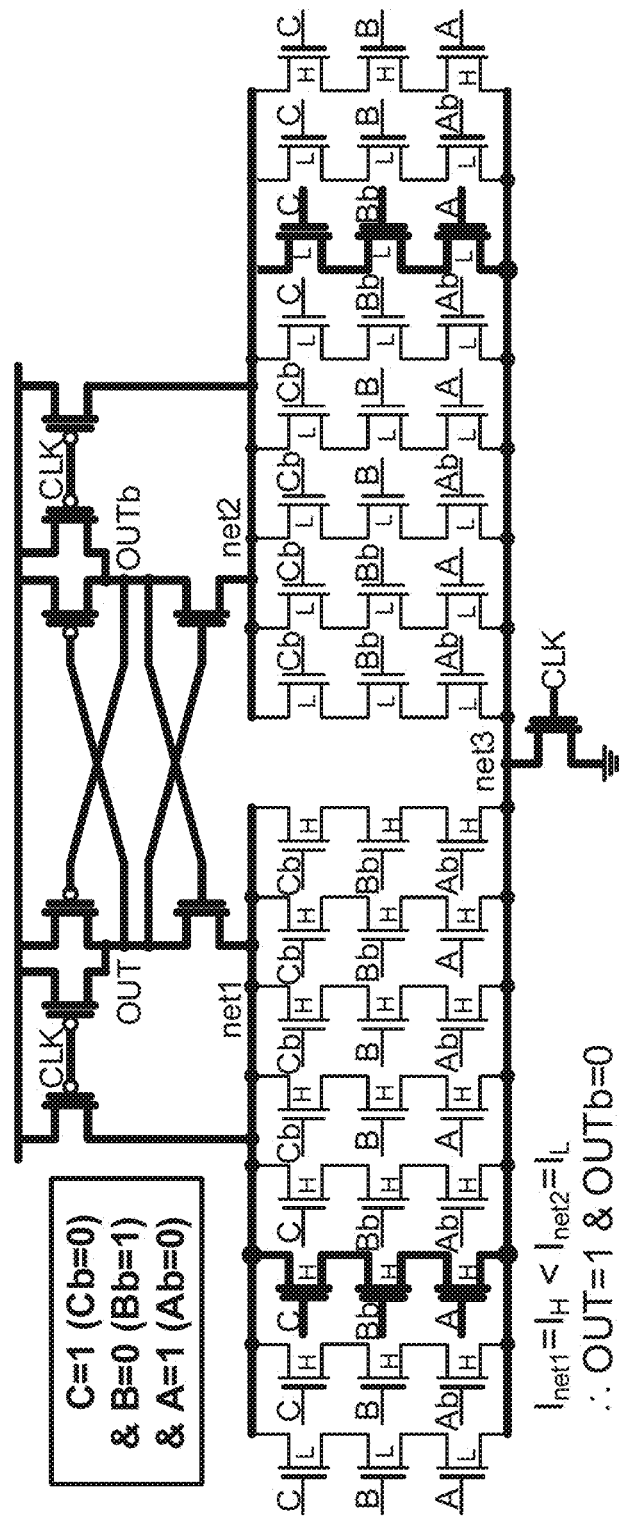
Figure 20G:
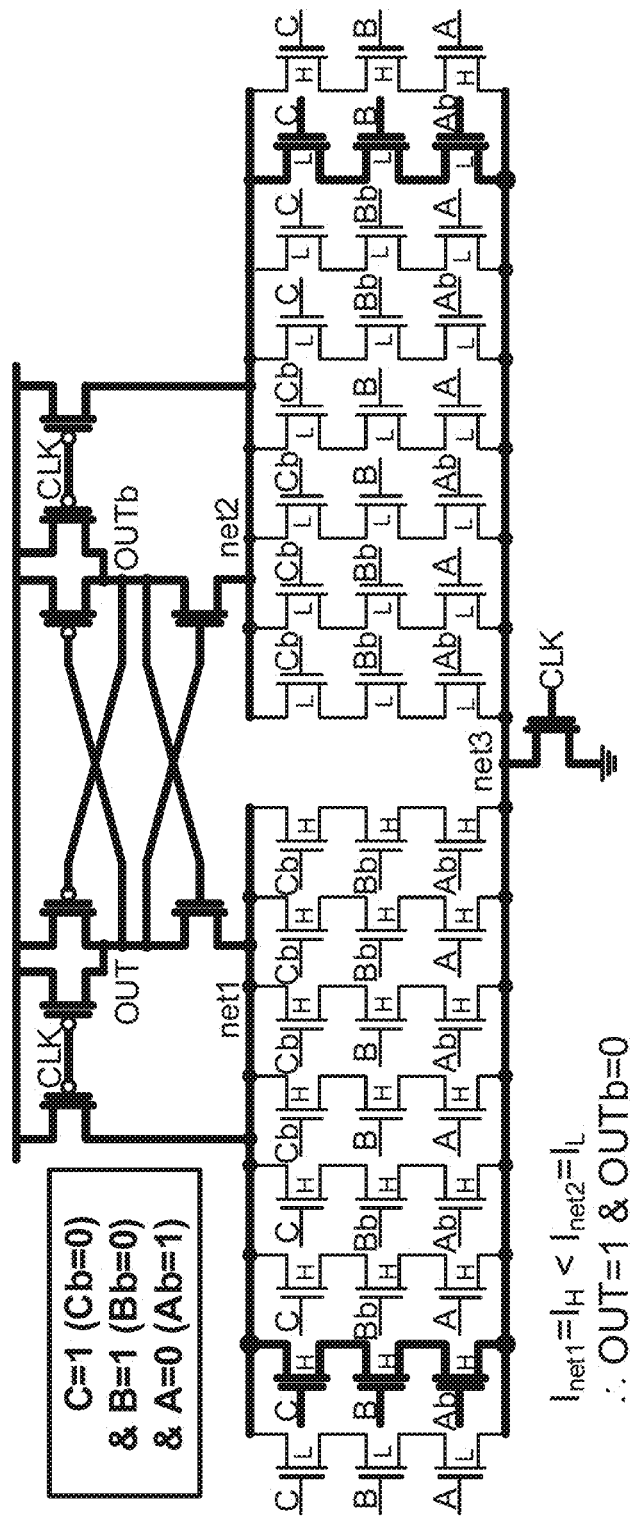
Figure 20H:
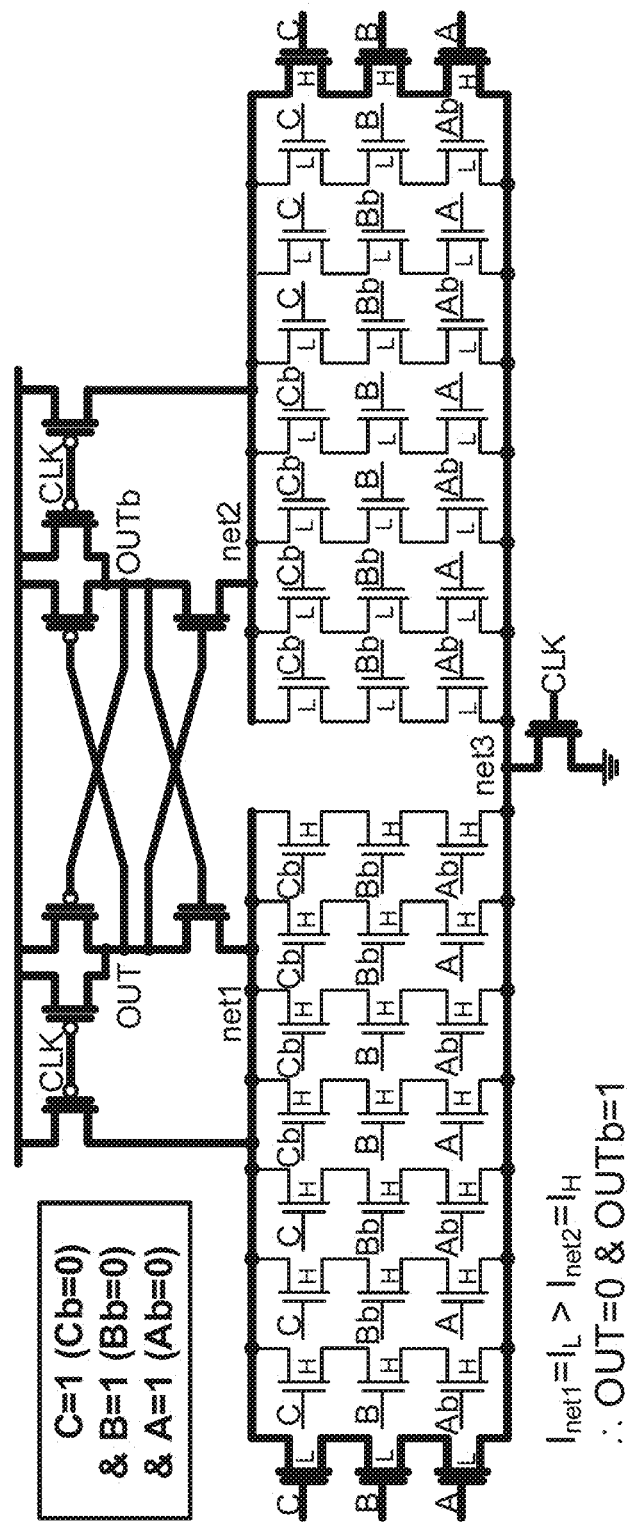

The three-input case for the conventional and exemplary architecture will be discussed next. The conventional TVD logic circuit for three-input is illustrated in FIGS. 19A-19B. A detailed illustration of the 3-input NAND TVD logic circuit is shown in FIGS. 20A-20H for different input combinations.

Figure 21A:
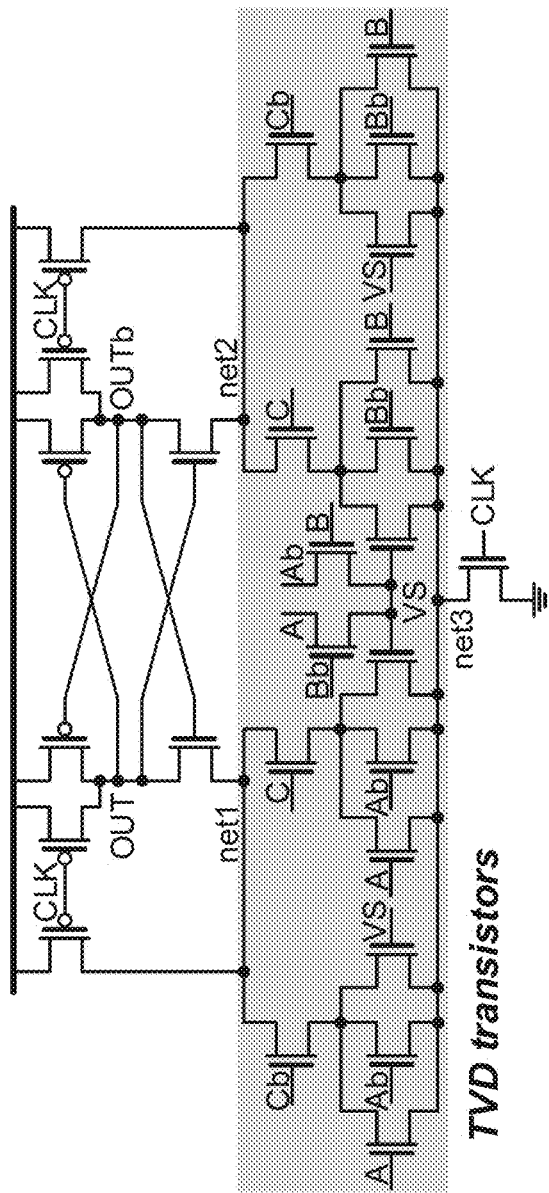
FIGS. 21A-21B illustrate an exemplary configuration of the 3-input E-TVD transistors for different Boolean functions in accordance with embodiments of the present disclosure.
Figure 21B:
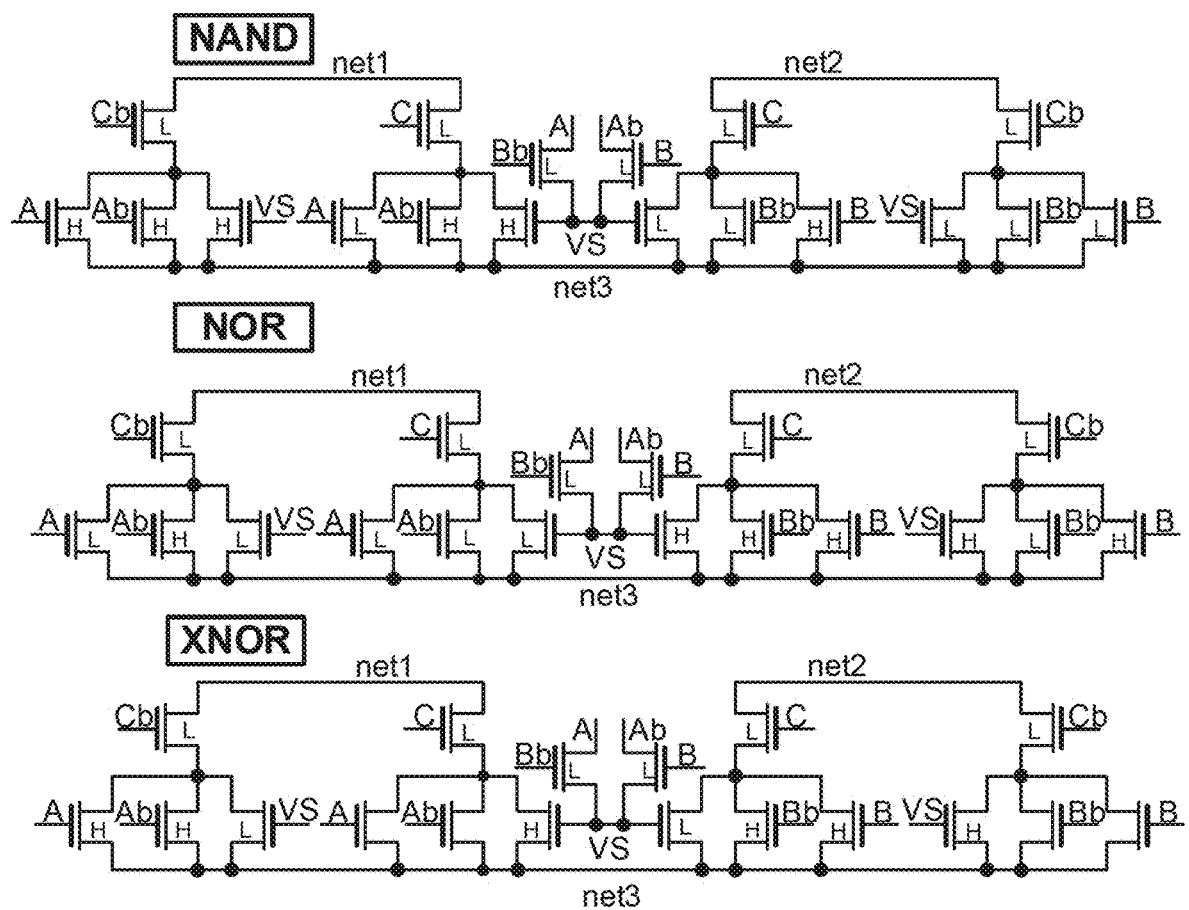
Figure 22A:
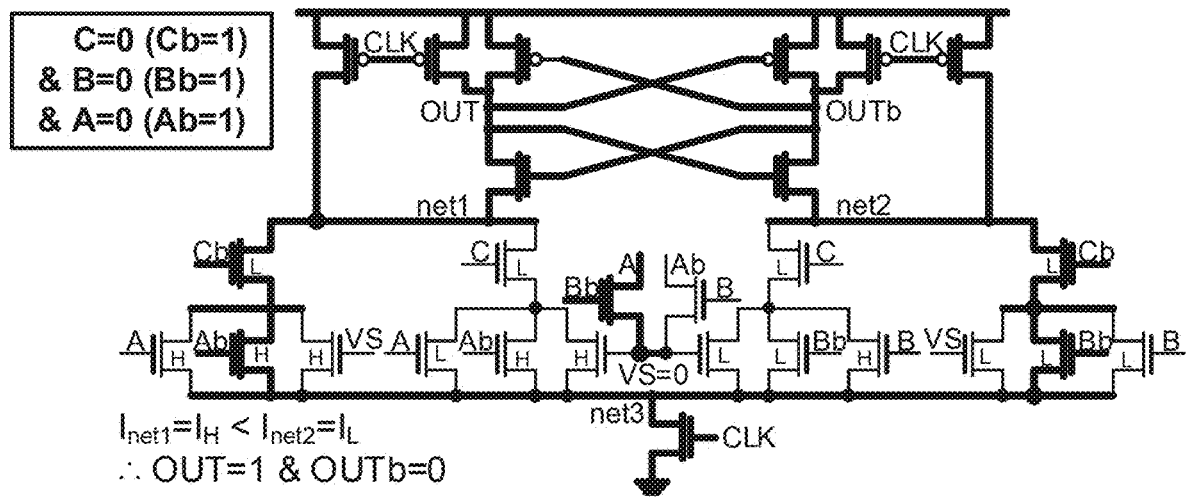
FIGS. 22A-22D illustrate turned on current paths depending on input combination for a NAND logic gate in accordance with embodiments of the present disclosure.
Figure 22A:
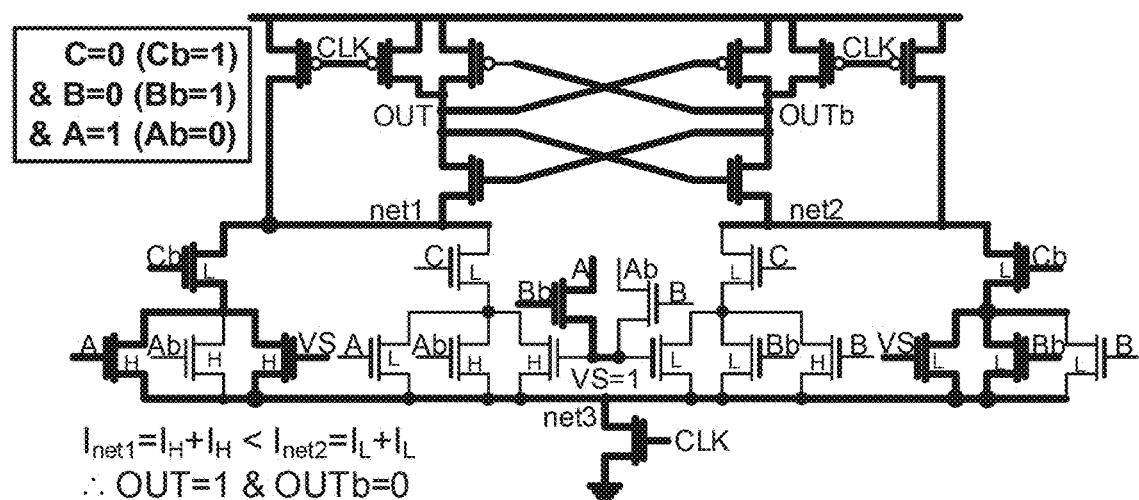
Figure 22B:
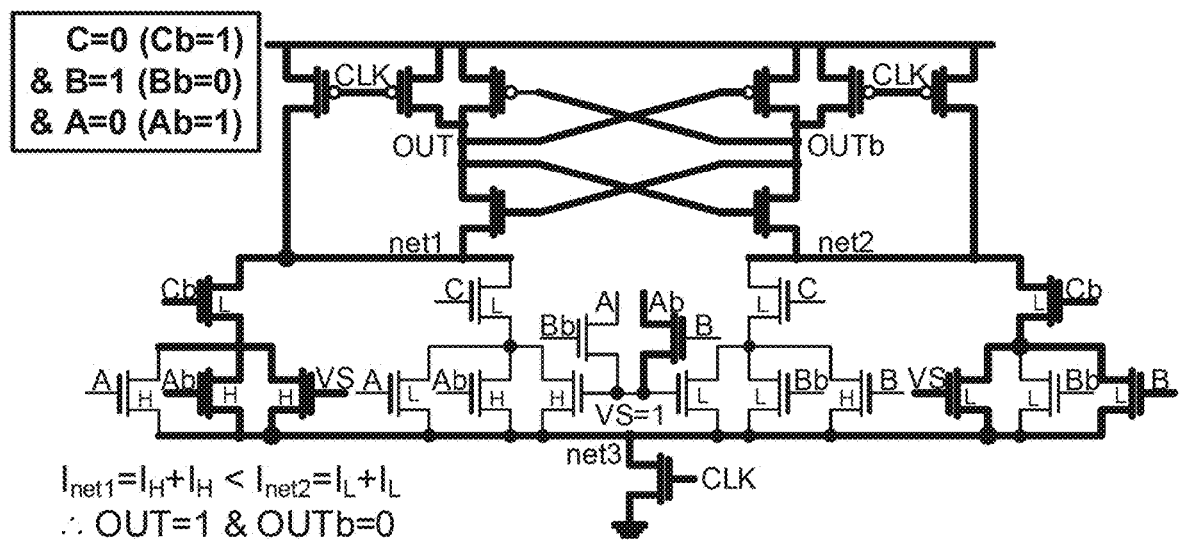
Figure 22B:
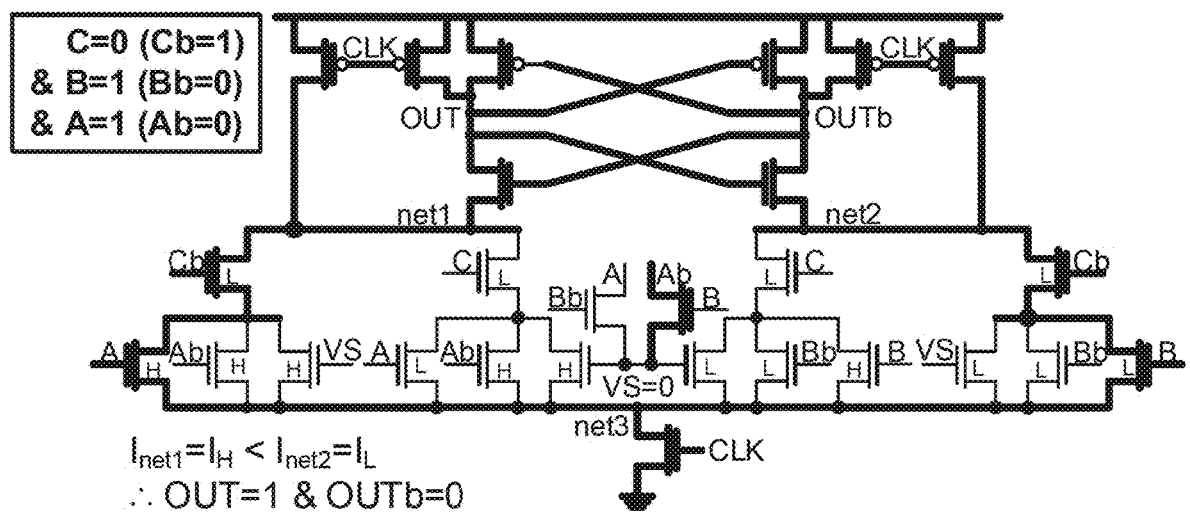
Figure 22C:
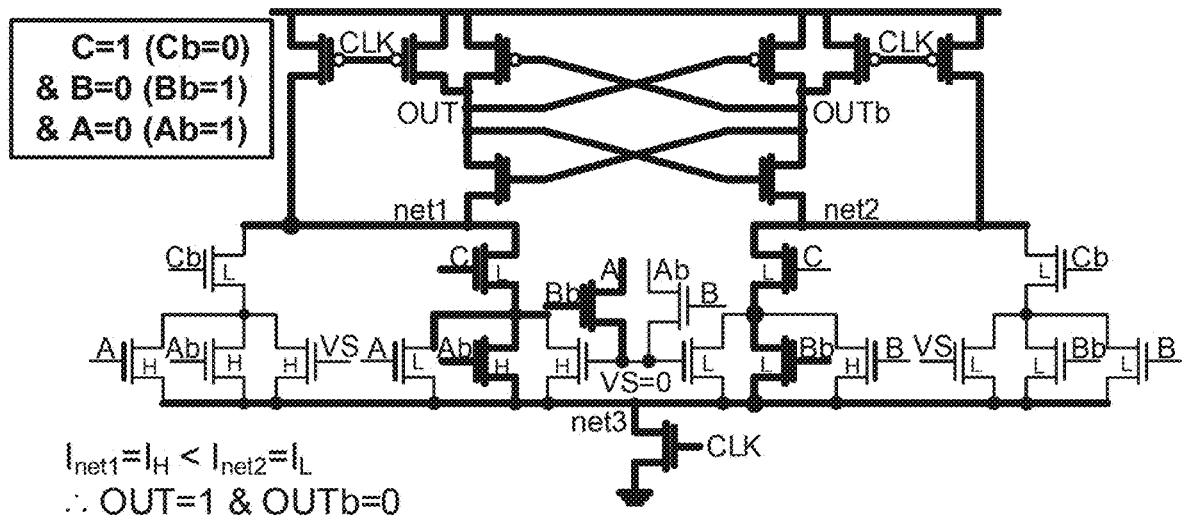
Figure 22C:
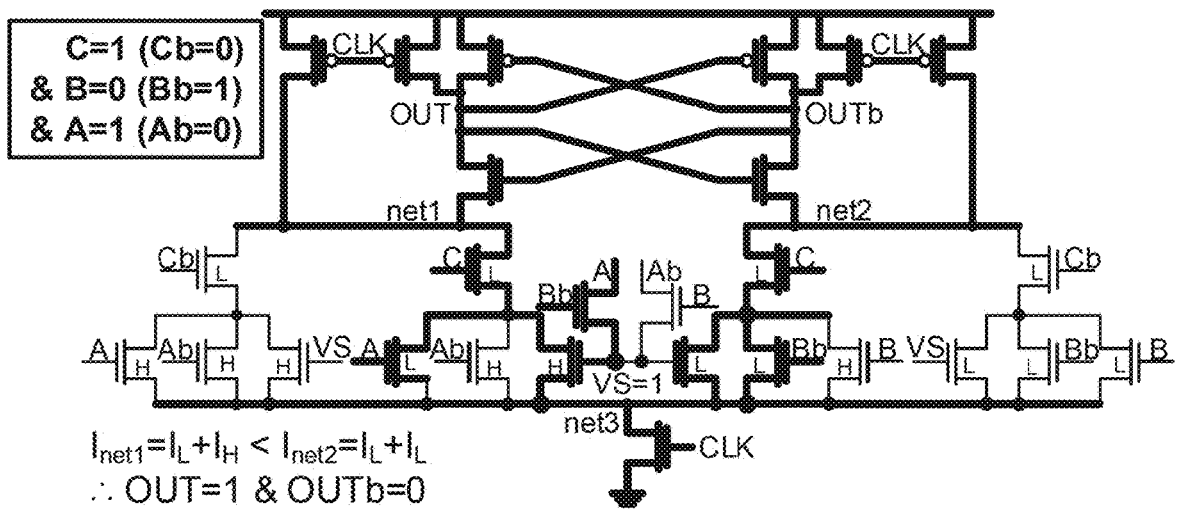
Figure 22D:
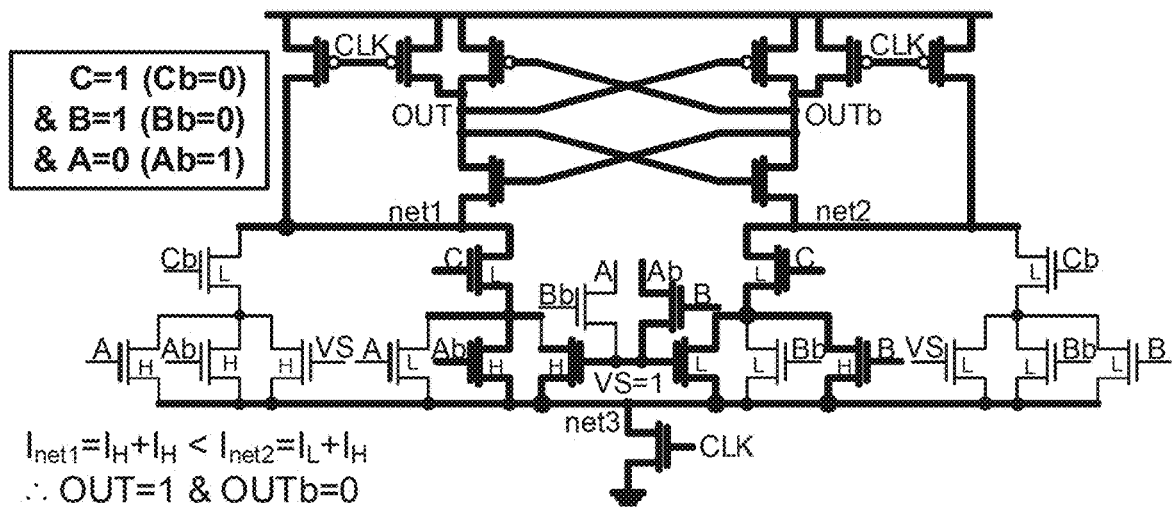
Figure 22D:
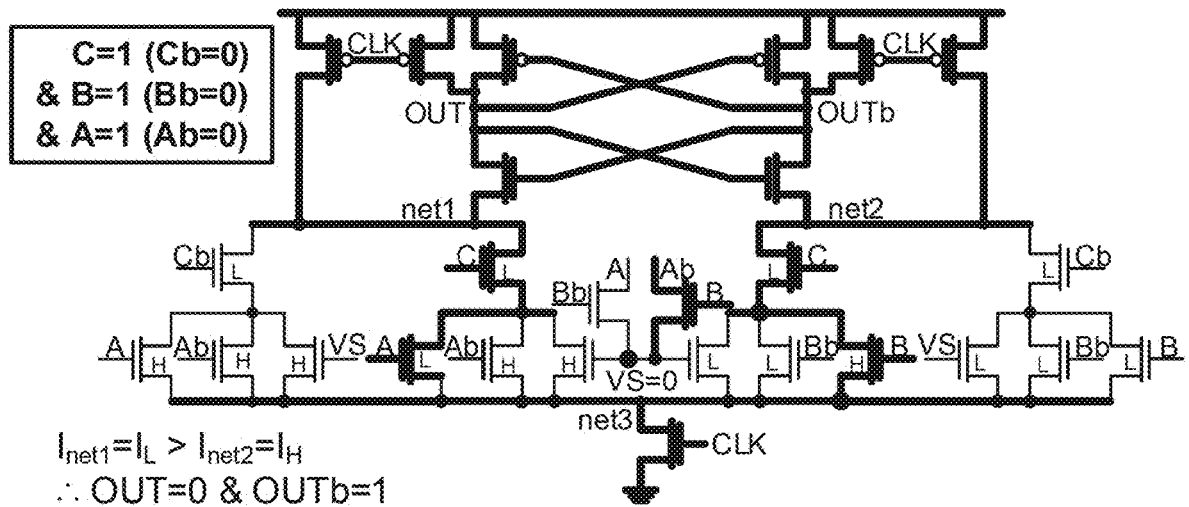
Figure 23A:
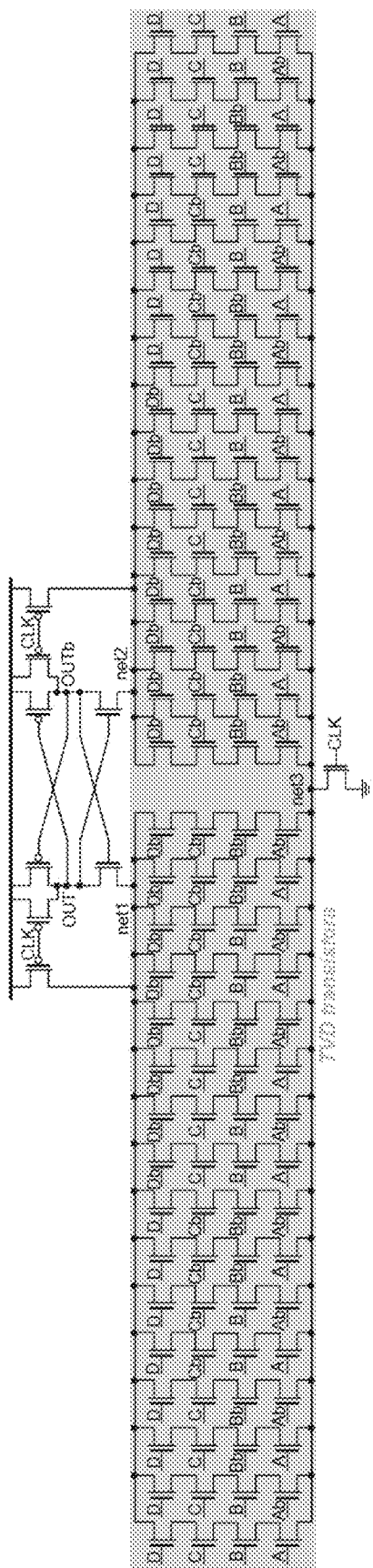
FIGS. 23A-23B illustrate a conventional configuration of 4-input TVD transistors for different Boolean functions.
Figure 23B:
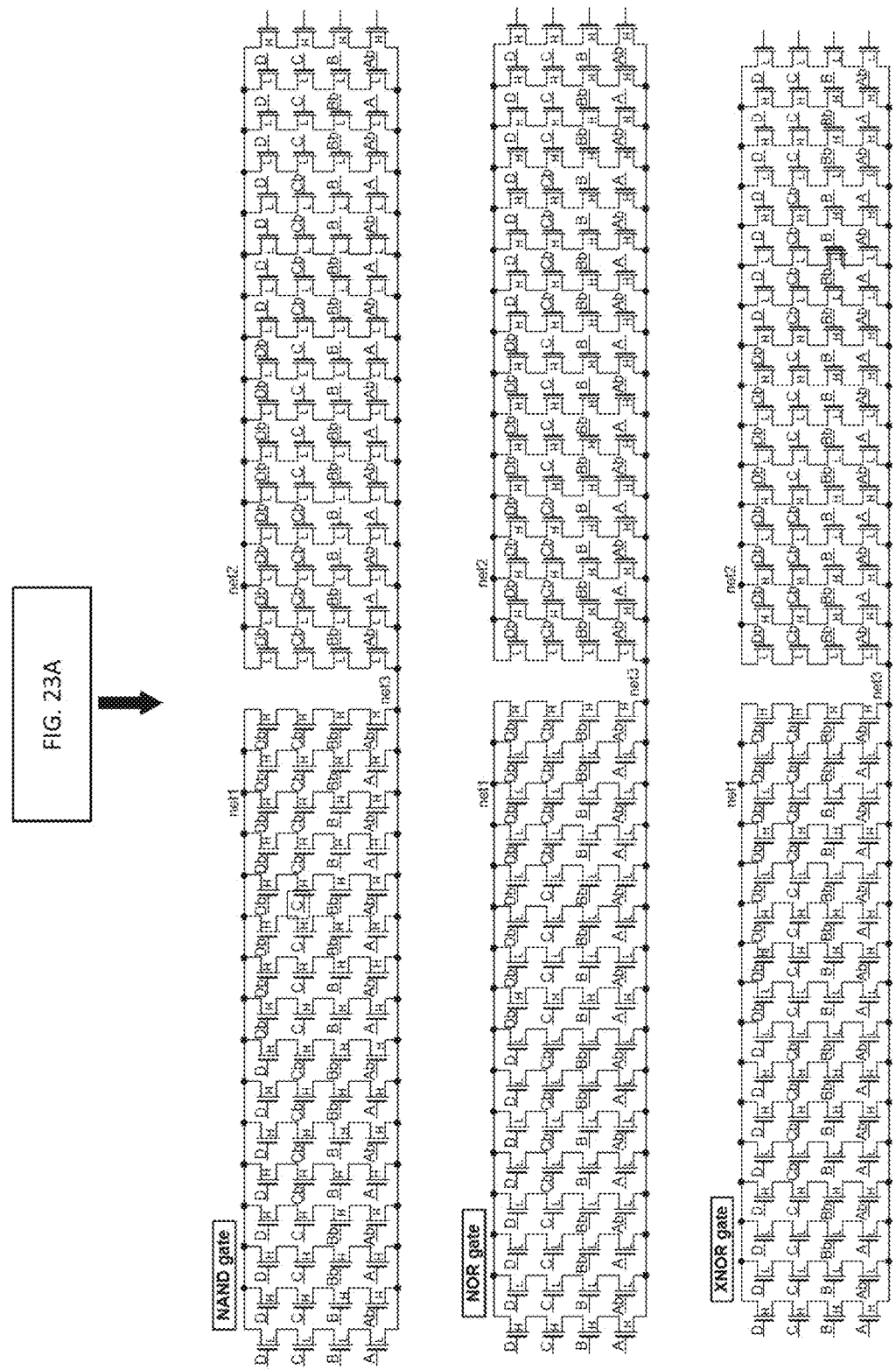
Figure 24A:
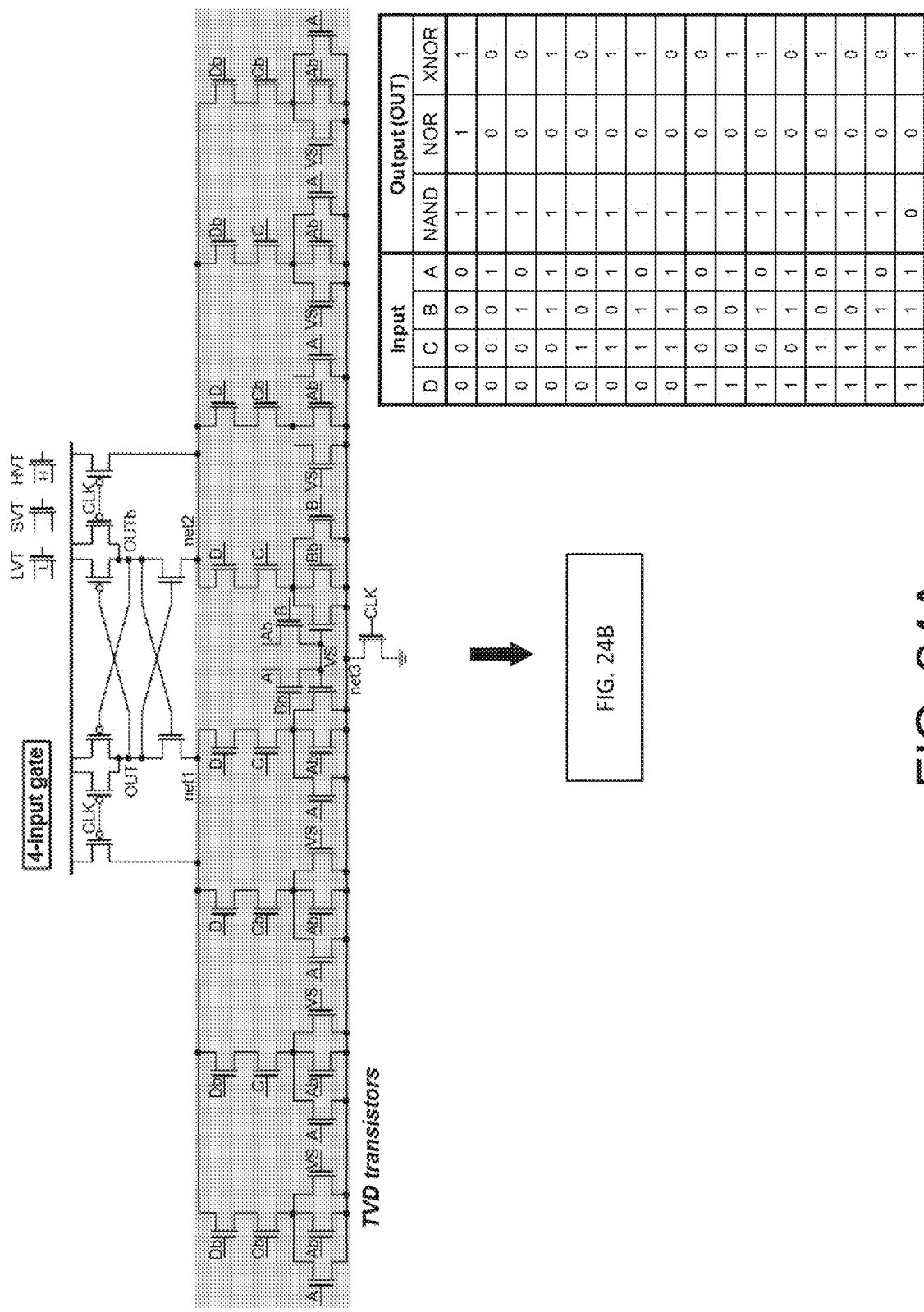
FIGS. 24A-24B illustrate an exemplary configuration of 4-input E-TVD transistors for different Boolean functions in accordance with embodiments of the present disclosure.
Figure 24B:
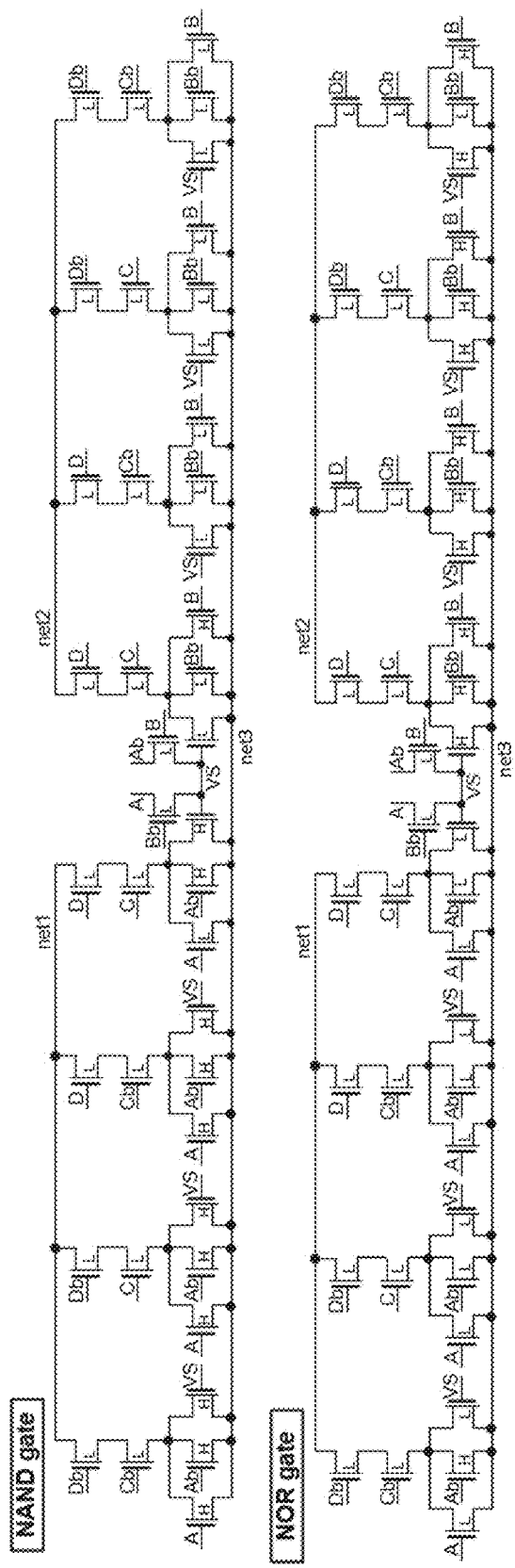

As shown in the above illustration, other than the input combination of A=B=C=1, HVT transistors in series is connected from net1 to net3 while LVT transistors are connected from net2 to net3. Thus, the current conducted from net2 to net3 is always larger than from net1 to net3 and OUT=1 & OUTb=0. For an input combination of A=B=C=1, it is vice versa. Using the parallel configuration previously mentioned for two-input E-TVD however, the above 3-input logic gate structure can be significantly reduced as shown in FIGS. 21A-21B.

Closely examining the truth table for 3-input logic gates, it can be seen for NAND gates that if C=0 (Cb=1), the output (OUT) is 1 regardless of input A and B. Thus, for C=0 (Cb=1), the parallel configuration transistors with input of A/Ab/VS from net1 to net3 are all HVT transistors and input of B/Bb/VS from net2 to net3 are all LVT transistors. Similarly for NOR gates, if C=1 (Cb=0), the output (OUT) is 0 regardless of input A and B. Thus, for C=1 (Cb=0), the parallel configuration transistors with input of A/Ab/VS from net1 to net3 are all LVT transistors and input of B/Bb/VS from net2 to net3 are all HVT transistors. For an XNOR gate, it is a bit different. Examining the truth table when C=0 and C=1, the output (OUT) is swapped depending on the input of A and B. Thus, the configuration as described above simply swaps the type of TVD devices connected to C or Cb transistors. A detailed illustration of the 3-input NAND E-TVD logic circuit is provided in FIGS. 22A-22D for different input combinations.

For C=0 (Cb=1) as mentioned above, the A/Ab/VS related transistors from net1 to net3 are all HVT devices and the B/Bb/VS related transistors from net2 to net3 are all LVT. Thus, a current from net2 to net3 is always larger than the current from net1 to net3 and OUT=1 & OUTb=0. For C=1 (Cb=0), the parallel configuration of the 2-input A & B is exactly the same as the 2-input E-TVD NAND gate and operates in the same manner.

The 4-input conventional TVD and an exemplary E-TVD are provided in FIGS. 23A-23B & 24A-24B and follow the concept explained above for 3-input logic gates. Comparison of the conventional TVD logic family and an exemplary E-TVD logic family is shown below (Table I) where N represents the number of inputs. The number of TVD transistors for E-TVD logic gate is nearly halved enabling fewer loading for the preceding stage as well.

TABLE I

|  | Conventional TVD | E-TVD |
|---|---|---|
| # of total TVD transistors | $2N \cdot 2^N$ | $(N+1) \cdot 2^{(N-1)} + 2$ |
| # of stacked TVD transistors from net1/net2 to net3 | N | N − 1 |
| # of transistors as load for preceding stage | $2^N$ | $\leq 2^{N-1}$ |

The total number of transistors used for an exemplary design is significantly smaller thereby saving a large amount of area. The stacked number of transistors from net1/net2 to net3 is an important factor regarding the propagation delay. As the exemplary E-TVD is one less stack compared to a conventional TVD due to the parallel configuration, the delay is reduced as well.

Figure 26A:
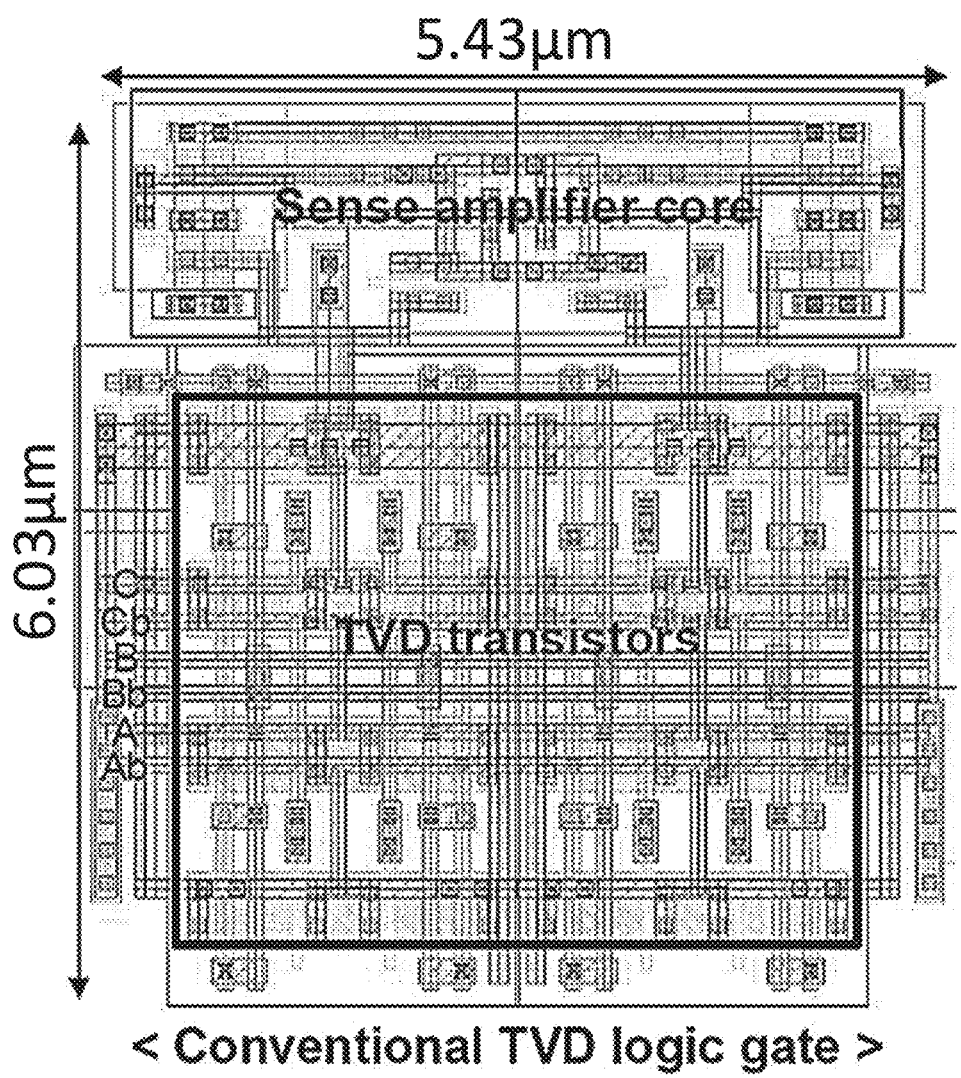
FIGS. 26A-26B illustrate (A) a layout of a 3-input conventional TVD logic gate and (B) an exemplary enhanced TVD logic gate for area comparison.
Figure 26B:
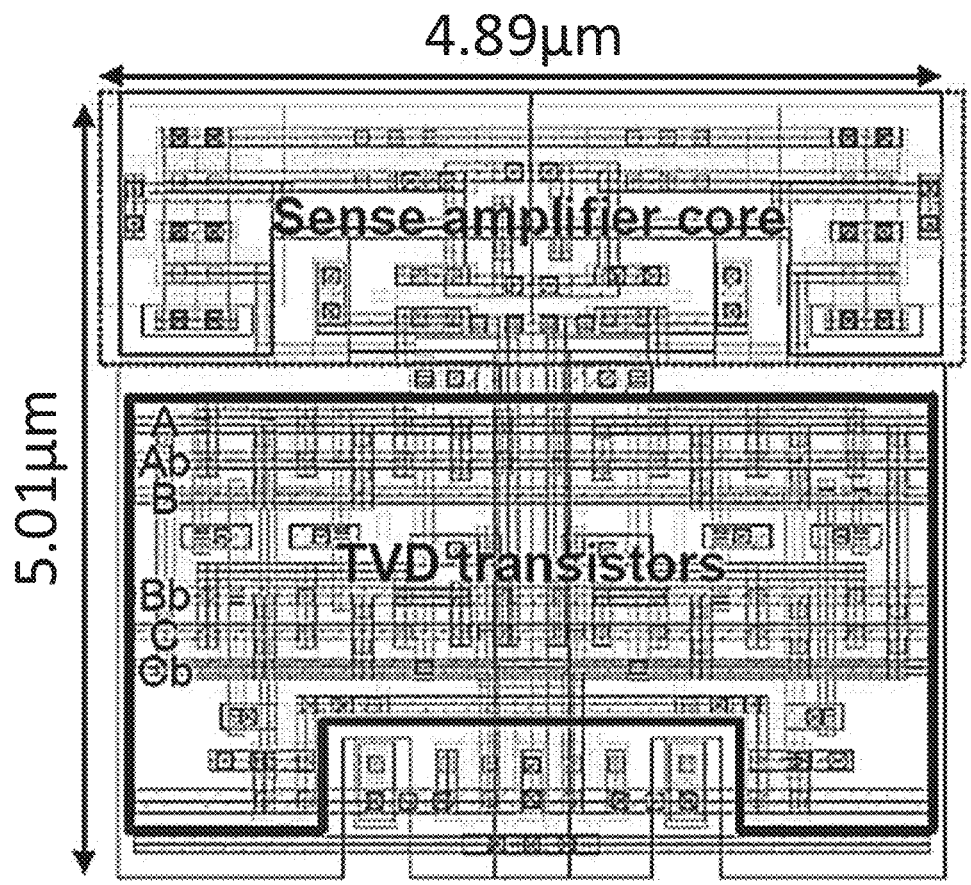
Figure 27A:
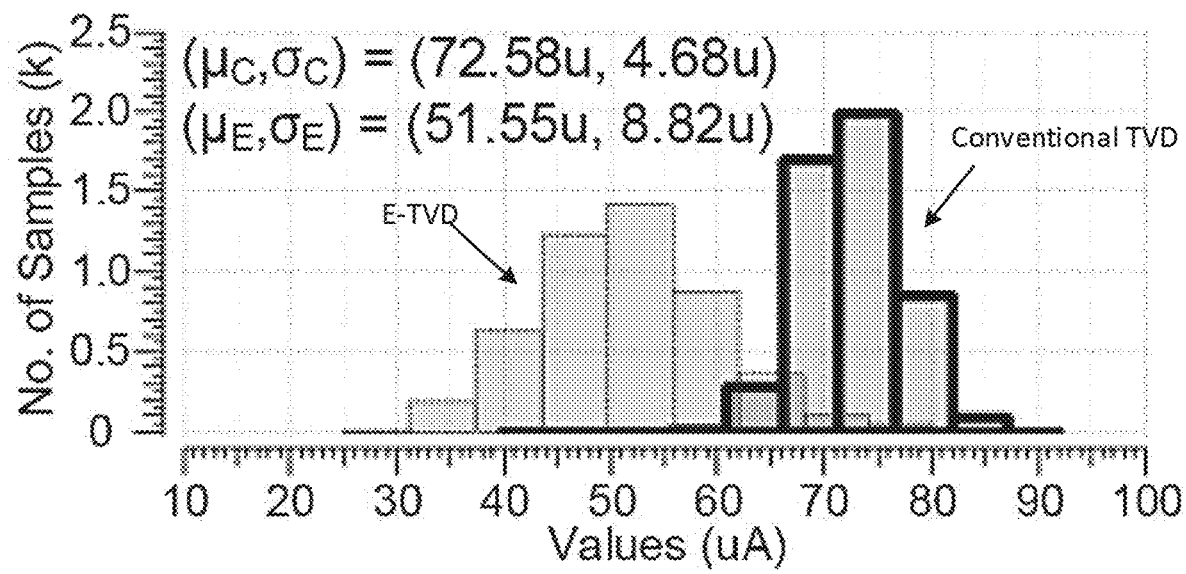
FIGS. 27A-27D illustrate Monte Carlo simulation results for an exemplary 2-input XNOR E-TVD logic gate and a conventional 2-input XNOR TVD logic gate in accordance with embodiments of the present disclosure.
Figure 27B:
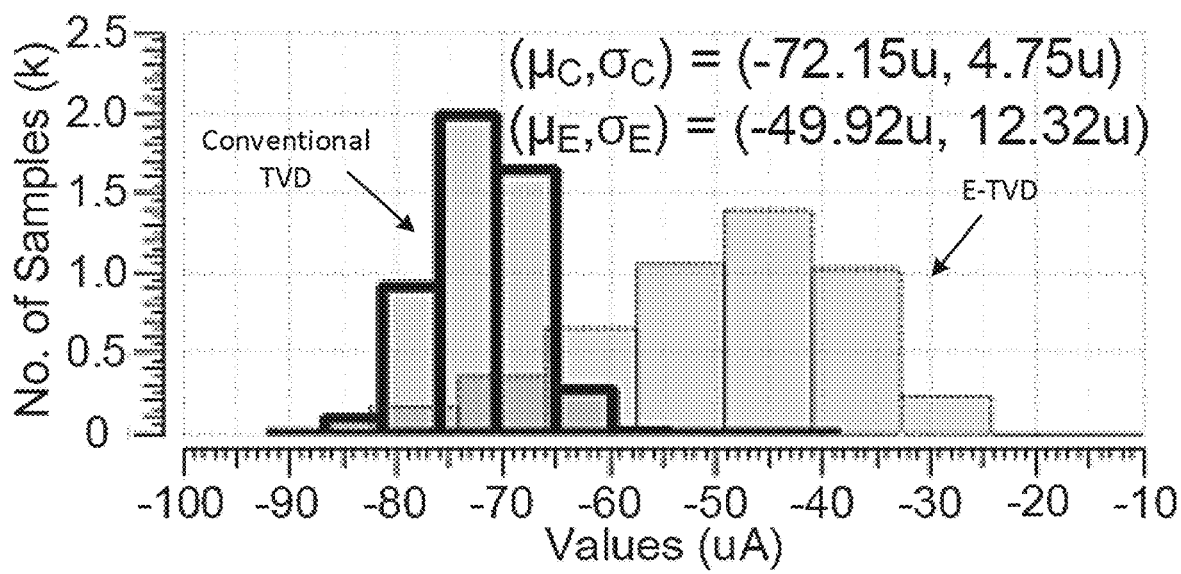
Figure 27C:
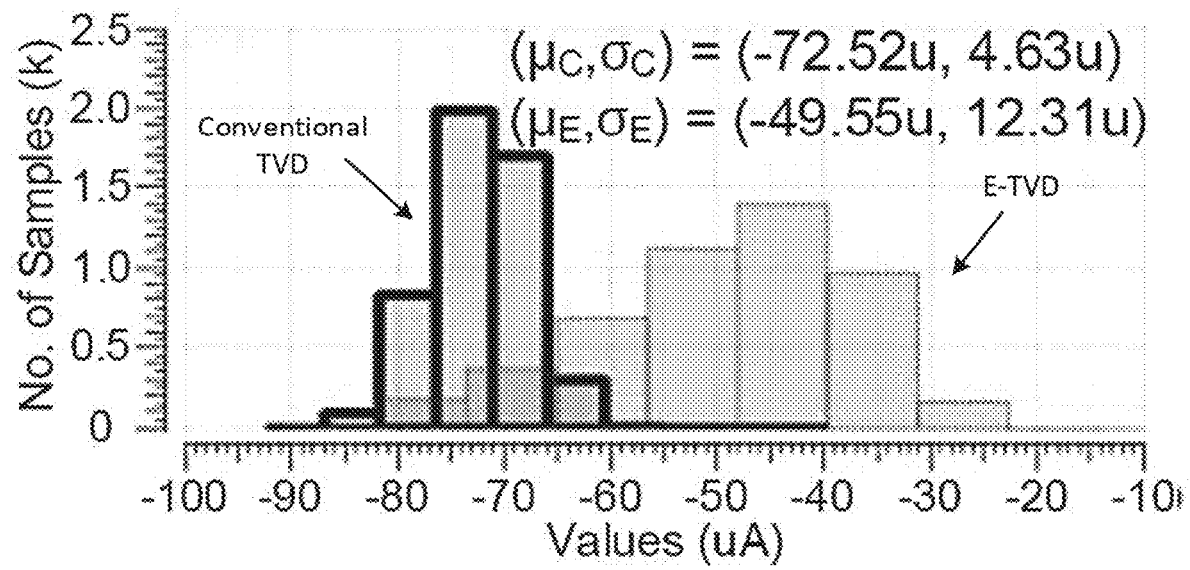
Figure 27D:
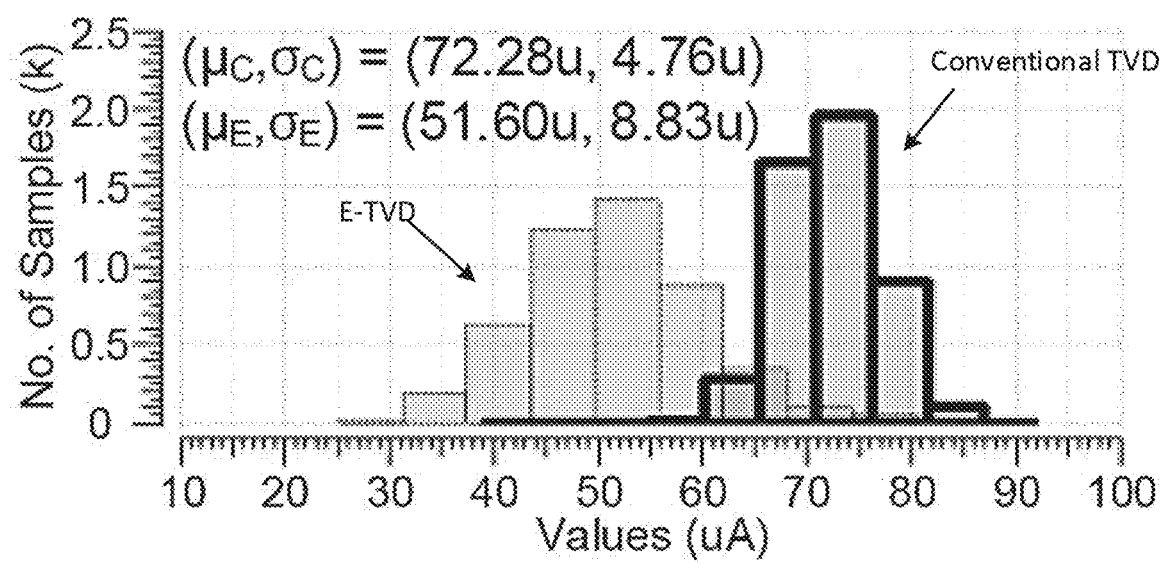

The layout of the 3-input conventional TVD and the proposed E-TVD logic family are shown in FIG. 26A-26B. For fair comparison, minimum spacing rule of the 65 nm process is followed to optimize the layout for both conventional TVD and E-TVD logic family. In addition, the same layout of the sense amplifier core is used for both designs. Due to the decreased number of TVD transistors, the area for a 2, 3, and 4-input logic family is reduced by 13%, 34%, and 80%, respectively. The area reduces significantly with the increased number of inputs.

Figure 25A:
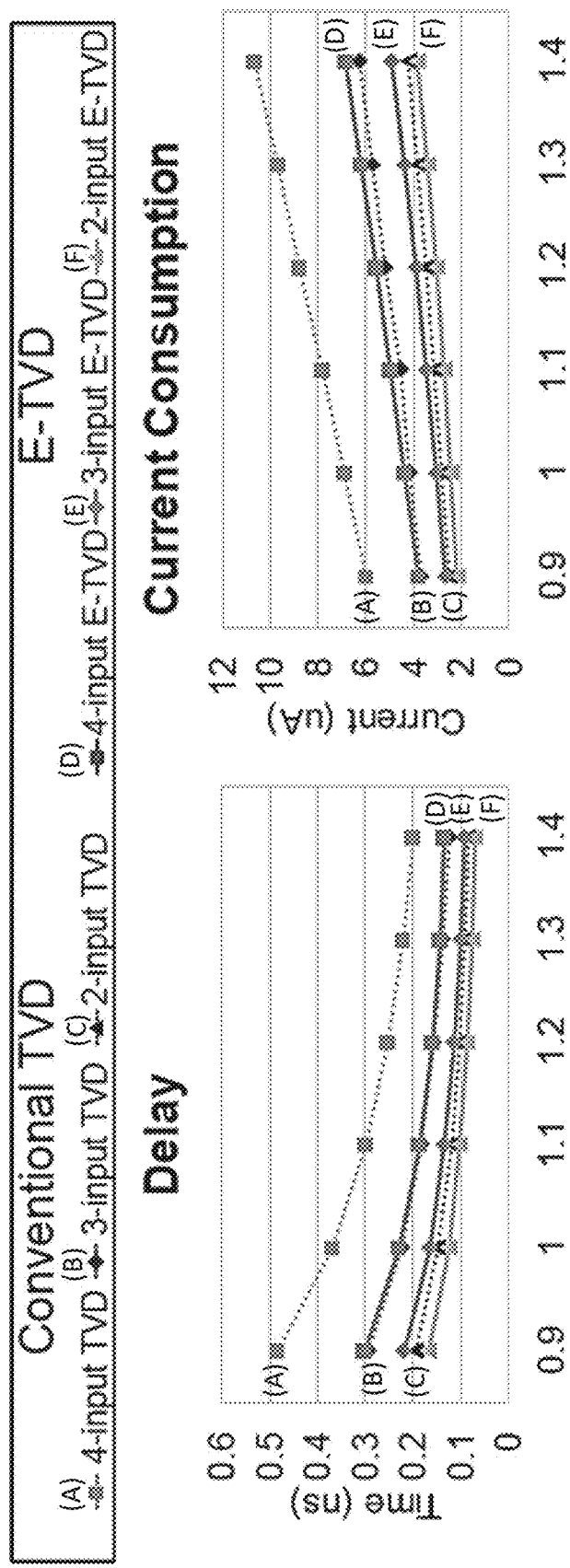
FIGS. 25A-25B illustrate delay and current consumption across voltage and temperature for (A) voltage versus delay and current consumption and (B) temperature versus delay and current consumption in accordance with an embodiment of the present disclosure.
Figure 25B:
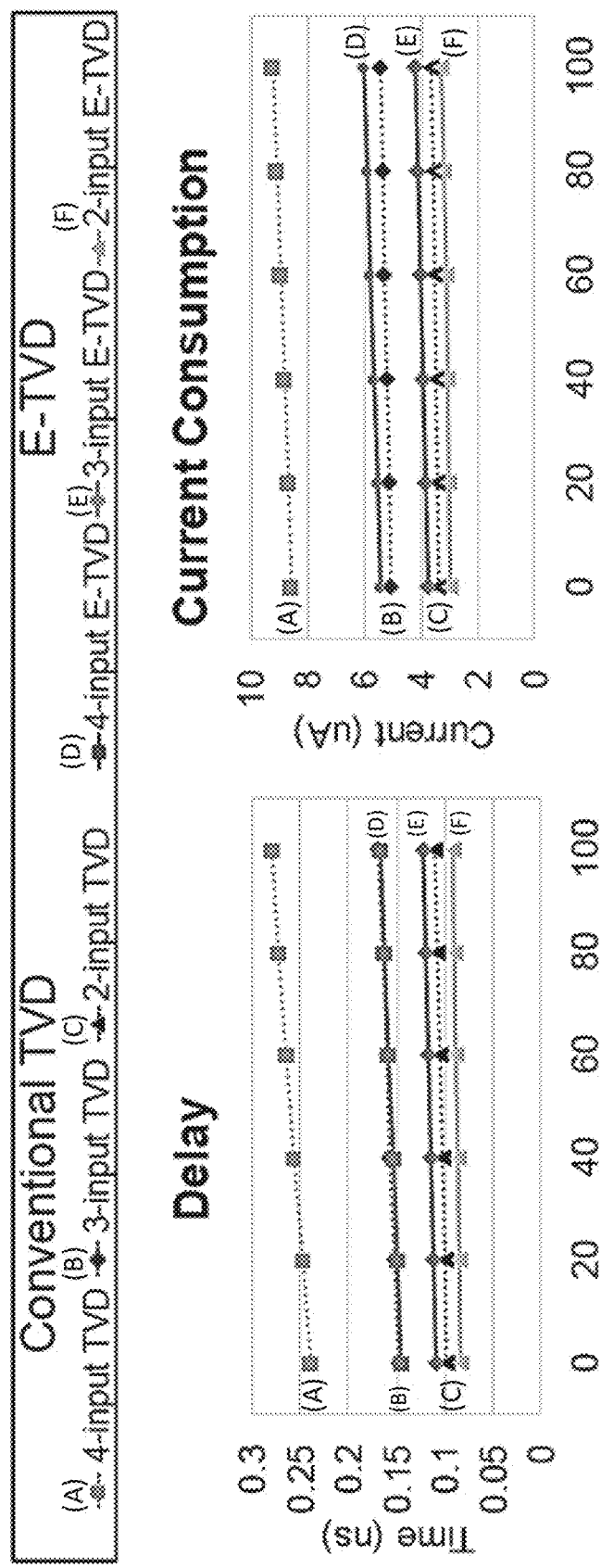

The propagation delay and current consumption of the two designs simulated across voltages and temperatures from 0.9V to 1.4V and 0° C. to 100° C., respectively are shown in FIG. 25A and FIG. 25B. The delay is measured between the time when CLK rises to 50% of the final value and when OUT or OUTb is pulled down to 50% of the final value. The average current consumption is measured with the clock operating at 100 MHz. The worst delay and current consumption result out of NAND, NOR, and XNOR gate for 2, 3, and 4-input is plotted. The exemplary E-TVD logic shows significant improvement due to the decreased number of total transistors and reduced stacked number of TVD transistors which all lead to smaller parasitic capacitances. For a 100 MHz operating clock, the TVD and E-TVD logic families are both functional up to 0.5V, 0.52V, and 0.54V for 2-inputs, 3-inputs and 4-inputs, respectively (functional defining correct output for all input combinations).

The delay and current consumption of an N-input E-TVD logic is similar to the (N−1)-input conventional TVD logic as the total number of cascaded transistors from net1 and net2 to net3 are the same. Performance summary at nominal condition is shown in Table II (below).

TABLE II

|  |  | Area (um$^2$) | Delay (ns) | Operating current (uA) | Leakage current (nA) |
|---|---|---|---|---|---|
| 2-input | TVD | 20.42 | 0.101 | 3.46 | 4.64 |
|  | E-TVD | 18.34 | 0.086 | 3.05 | 4.28 |
| 3-input | TVD | 32.74 | 0.154 | 5.18 | 3.70 |
|  | E-TVD | 24.50 | 0.113 | 3.88 | 5.21 |
| 4-input | TVD | 70.45 | 0.252 | 8.76 | 3.85 |
|  | E-TVD | 39.15 | 0.158 | 5.56 | 5.42 |

Verifying the robustness against process variation is important for $V_T$ leveraged logic gates as it uses the relative value of $V_T$ for its operation. To evaluate the robustness of the design, a global Monte Carlo simulation is performed at nominal condition with the 2-input XNOR logic gate for both TVD and E-TVD logic family. An XNOR logic gate is chosen as it uses all the different $V_T$ devices and therefore creates the smallest current difference between $I_{net1}$ and $I_{net2}$ depending on the input combination for E-TVD logic family.

The dynamic current difference (not the average) between $I_{net1}$ and $I_{net2}$ is taken when the output decision occurs. Every possible input combination is tested for 5000 samples as shown in FIGS. 27A-27D for an input combination of (A) AB=11, (B) AB=01, (C) AB=10, and (D) AB=00. Ideally, the distribution for input combinations of 11 and 00 should always be positive and for 01 and 10 should always be negative. Simulation results in FIGS. 27A-27D verify this and reflect that there is no output flip to show the robustness. The TVD logic family shows smaller variation ($\sigma_C$: variation for TVD logic family, $\sigma_E$: variation for E-TVD logic family) which reflects better robustness than E-TVD logic family as it uses only LVT and HVT transistors compared to E-TVD logic family creating larger difference between $I_{net1}$ and $I_{net2}$.

Although TVD and E-TVD logic gates are extremely difficult to reverse engineer, both TVD and E-TVD logic gates can be vulnerable to side channel attacks that can reveal the difference of the delay or the current consumption depending on the type of the Boolean function or the input combination. Thus, the delay and average current consumption of 2-input logic gates (NAND, NOR, and XNOR are used for comparison) are simulated with all possible input combinations for comparison at nominal condition. For TVD logic gates, the maximum deviation of delay and current consumption is 1.1 and 0.6%, respectively while for E-TVD logic gates is 4.9% and 4.0%, respectively. The E-TVD logic gates have larger deviations as it uses all three $V_T$ devices for different Boolean functions whereas TVD logic gates only use LVT and HVT transistors. In addition, the E-TVD logic gates for different input combinations turn on either one or two current paths.

A 4-bit ripple adder is implemented using TVD and E-TVD logic gates to check its feasibility as combinational circuits. A complementary CMOS and sense amplifier-based logic (SABL) based ripple adder is also designed for comparison. Eight 3-input TVD and E-TVD logic gates are necessary (4 as summing logic and 4 as carry logic) to build a 4-bit ripple adder. The same geometry of PMOS and NMOS transistors is used for all four structures. Post layout simulation is performed at nominal condition. A comparison of the four different 4-bit ripple adder is summarized in Table III (below).

TABLE III

|  | Area (um$^2$) | Delay (ns) | Operating current (nA) |
|---|---|---|---|
| Complementary | 55.72 | 0.29 | 17.12 |
| SABL | 186.41 | 0.34 | 15.42 |
| TVD | 258.47 | 0.61 | 35.22 |
| E-TVD | 194.43 | 0.48 | 26.11 |

The complementary 4-bit ripple adder as shown in Table III is the most efficient structure in terms of area, delay, and current consumption. However, the structure is easily revealed through reverse engineering and susceptible to side channel attacks. The SABL based adder is less vulnerable to side channel attacks such as differential power analysis but the structure is prone to reverse engineering. The E-TVD logic-based adder is comparable to the SABL based adder over the TVD logic-based adder and thus is efficient for logic designs that require protection against reverse engineering.

In accordance with the present disclosure, a new TVD logic gate expanding on the conventional structure is presented. Using a parallel configuration approach instead of a stacked approach for 2 inputs, an exemplary E-TVD is more efficient than the conventional design in all aspects such as delay, current consumption, and area. Such an exemplary E-TVD is suitable for obfuscation against reverse engineering.

The present disclosure describes systems, apparatuses, and methods for implementing a logic gate circuit structure for operating one or more Boolean functions. In one embodiment, such a system comprises a first group of parallel transistors connected between a first node (net1) and a second node (net3), wherein the first group of parallel transistors includes at least three first transistors; a second group of parallel transistors connected between a third node (net2) and the second node, wherein the second group of parallel transistors include at least three second transistors, wherein a gate input of one of the second transistors is connected to a gate input of one of the first transistors at a fourth node (VS); a pair of third transistors connected to the fourth node (VS); and wherein each of the first, second, and third transistors in the logic gate circuit structure have a same physical structure. In one embodiment, the logic gate circuit structure has a 2-input configuration that places one of the inputs and its complementary signal between the first node (net1) and the second node (net3) and the other input and its complementary signal between the third node (net2) and the second node (net3).

In an alternative embodiment, a logic gate circuit structure for operating one or more Boolean functions comprises a first group of transistors connected between a first node (net1) and a second node (net3), wherein the first group of transistors include two subgroups of first transistors, wherein each of the subgroups of first transistors include one or more first transistors serially connected between the first node (net1) and a junction node and a set of three paralleled first transistors connected between the junction node and the second node (net3); a second group of transistors connected between a third node (net2) and the second node (net3), wherein the second group of transistors include two subgroups of second transistors, wherein each of the subgroups of second transistors include one or more second transistors serially connected between the third node (net2) and a junction node and a set of three paralleled second transistors connected between the junction node and the second node (net3), wherein a gate input of one of the paralleled second transistors is connected to a gate input of one of the paralleled first transistors at a fourth node (VS); a pair of third transistors connected to the fourth node (VS); and wherein each of the first, second, and third transistors in the logic gate circuit structure have a same physical structure. In one embodiment, the logic gate circuit structure has an input configuration for more than 2 inputs (e.g., a 3-input configuration, a 4-input configuration, etc.) that places one of the inputs and its complementary signal between the first node (net1) and the second node (net3) and the other input and its complementary signal between the third node (net2) and the second node (net3).

Figure 28:
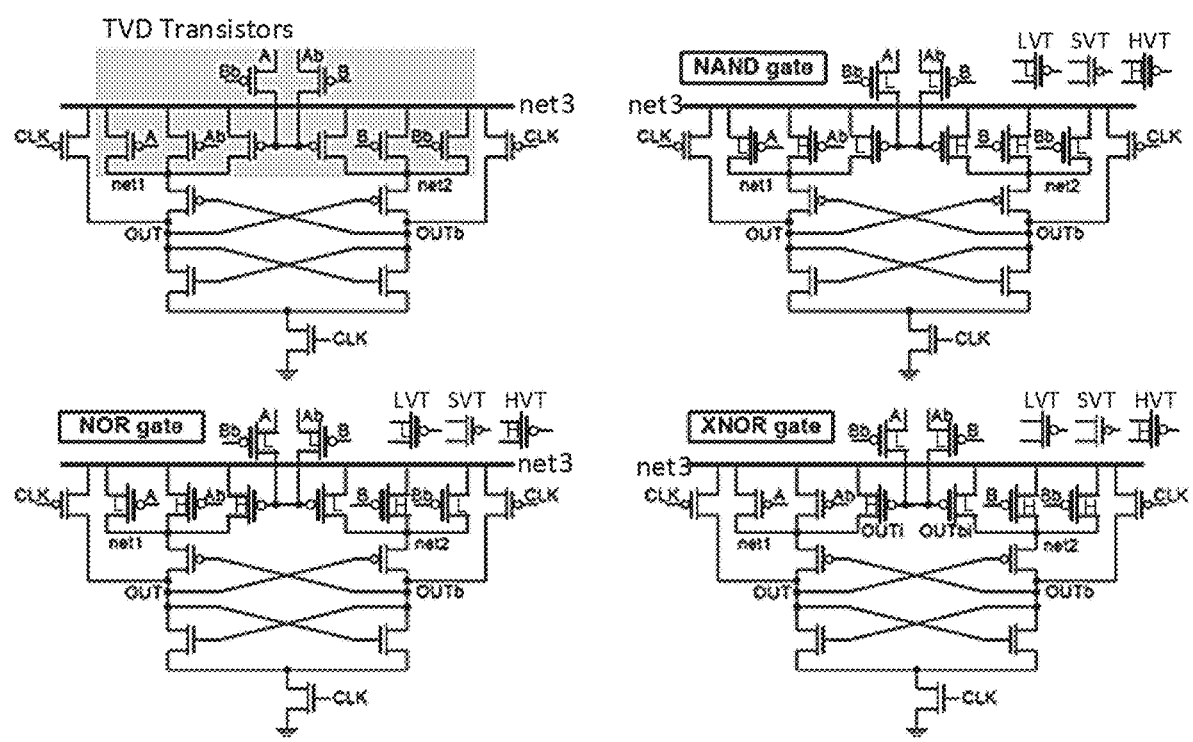
FIG. 28 illustrates a configuration of TVD PMOS transistors for 2-input NAND, NOR, and XNOR Boolean functions in accordance with embodiments of the present disclosure.

While the above-illustrated examples include NMOS transistors, exemplary embodiments of the present disclosure are not limited to only including NMOS transistors. For example, FIG. 28 illustrates a configuration of TVD PMOS transistors for 2-input NAND, NOR, and XNOR Boolean functions in accordance with embodiments of the present disclosure. In this non-limiting example, net3 corresponds to VDD, and an exemplary 2-input configuration places one of the inputs and its complementary signal (A and Ab) between net1 and net3 and the other input and its complementary signal (B and Bb) between net2 and net3 as a parallel connection.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure. All such modifications and variations are intended to be included herein within the scope of this disclosure.

The invention claimed is:

1. A logic gate circuit structure for operating one or more Boolean functions comprising:
   a first group of parallel transistors connected between a first node (net1) and a second node (net3) of a sense amplifier, wherein the first group of parallel transistors includes at least three first transistors;
   a second group of parallel transistors connected between a third node (net2) and the second node (net3) of the sense amplifier, wherein the second group of parallel transistors include at least three second transistors, wherein a gate input of one of the second transistors is connected to a gate input of one of the first transistors at a fourth node (VS);
   a pair of third transistors connected to the fourth node (VS);
   wherein each of the first, second, and third transistors in the logic gate circuit structure have a same physical structure;
   wherein the logic gate circuit structure has a 2-input configuration that places one of the inputs and its complementary signal between the first node (net1) and the second node (net3) and the other input and its complementary signal between the third node (net2) and the second node (net3); and
   wherein one of the inputs and its complementary signal is connected to the pair of third transistors, wherein the other input and its complementary signal is connected to the pair of third transistors.

2. The logic gate circuit structure of claim 1, wherein the plurality of first, second, and third transistors are a combination of at least two of low voltage threshold transistors, high voltage threshold transistors, and standard voltage threshold transistors.

3. The logic gate circuit structure of claim 2, wherein the high voltage threshold transistor has a voltage threshold of substantially 600 mV, the standard voltage threshold transistor has a voltage threshold of substantially 500 mV, and the low voltage threshold transistor has a voltage threshold of substantially 300 mV.

4. The logical gate circuit structure of claim 1, wherein the plurality of first, second, and third transistors are a combination of low voltage threshold transistors, standard voltage threshold transistors, and high voltage threshold transistors, wherein the logic gate circuit structure is configured to operate a NAND logic gate.

5. The logical gate circuit structure of claim 1, wherein the plurality of first, second, and third transistors are a combination of low voltage threshold transistors, standard voltage threshold transistors, and high voltage threshold transistors, wherein the logic gate circuit structure is configured to operate a NOR logic gate.

6. The logical gate circuit structure of claim 1, wherein the plurality of first, second, and third transistors are a combination of low voltage threshold transistors, high voltage threshold transistors, and standard voltage threshold transistors, wherein the logic gate circuit structure is configured to operate an XNOR logic gate.

7. The logical gate circuit structure of claim 1, wherein the plurality of first, second, and third transistors comprise NMOS transistors.

8. A logic gate circuit structure for operating one or more Boolean functions comprising:
   a first group of parallel transistors connected between a first node (net1) and a second node (net3) of a sense amplifier, wherein the first group of parallel transistors includes at least three first transistors;
   a second group of parallel transistors connected between a third node (net2) and the second node (net3) of the sense amplifier, wherein the second group of parallel transistors include at least three second transistors, wherein a gate input of one of the second transistors is connected to a gate input of one of the first transistors at a fourth node (VS);
   a pair of third transistors connected to the fourth node (VS);
   wherein each of the first, second, and third transistors in the logic gate circuit structure have a same physical structure; and
   wherein the Boolean functions correspond to a NAND logic gate, a NOR logic gate, and an XNOR logic gate.

9. The logical gate circuit structure of claim 8, wherein the plurality of first, second, and third transistors are a combination of low voltage threshold transistors, standard voltage threshold transistors, and high voltage threshold transistors.

10. The logical gate circuit structure of claim 9, wherein the plurality of first, second, and third transistors are a combination of at least two of low voltage threshold transistors, high voltage threshold transistors, and standard voltage threshold transistors.

11. A logic gate circuit structure for operating one or more Boolean functions comprising:
   a first group of transistors connected between a first node (net1) and a second node (net3) of a sense amplifier, wherein the first group of transistors include two subgroups of first transistors, wherein each of the subgroups of first transistors include one or more first transistors serially connected between the first node (net1) and a junction node and a set of three paralleled first transistors connected between the junction node and the second node (net3);

a second group of transistors connected between a third node (net2) and the second node (net3) of the sense amplifier, wherein the second group of transistors include two subgroups of second transistors, wherein each of the subgroups of second transistors include one or more second transistors serially connected between the third node (net2) and a junction node and a set of three paralleled second transistors connected between the junction node and the second node (net3), wherein a gate input of one of the paralleled second transistors is connected to a gate input of one of the paralleled first transistors at a fourth node (VS);

a pair of third transistors connected to the fourth node (VS); and wherein each of the first, second, and third transistors in the logic gate circuit structure have a same physical structure.

12. The logic gate circuit structure of claim 11, wherein the logic gate circuit structure has a 3-input configuration that places one of the inputs and its complementary signal between the first node (net1) and the second node (net3), a second one of its inputs and its complementary signal between the third node (net2) and the second node (net3), and a third one of its inputs and its complementary signal between the first node (net1) and the second node (net3) and between the third node (net2) and the second node (net3), wherein the one or more first transistors is a single first transistor, wherein the one or more second transistors is a single second transistor.

13. The logic gate circuit structure of claim 11, wherein the logic gate circuit structure has a 4-input configuration that places one of the inputs and its complementary signal between the first node (net1) and the second node (net3), a second one of its inputs and its complementary signal between the third node (net2) and the second node (net3), and a third one of its inputs and its complementary signal between the first node (net1) and the second node (net3) and between the third node (net2) and the second node (net3), wherein the one or more first transistors is a pair of first transistors connected in series, wherein the one or more second transistors is a pair of second transistors connected in series.

14. The logic gate circuit structure of claim 11, where the plurality of first, second, and third transistors are a combination of at least two of low voltage threshold transistors, high voltage threshold transistors, and standard voltage threshold transistors.

15. The logic gate circuit structure of claim 14, wherein the high voltage threshold transistor has a voltage threshold of substantially 600 mV, the standard voltage threshold transistor has a voltage threshold of substantially 500 mV, and the low voltage threshold transistor has a voltage threshold of substantially 300 mV.

16. The logic gate circuit structure of claim 11, wherein the Boolean functions correspond to a NAND logic gate, a NOR logic gate, and an XNOR logic gate.

17. The logic gate circuit structure of claim 11, wherein the plurality of first, second, and third transistors are a combination of low voltage threshold transistors and high voltage threshold transistors, wherein the logic gate circuit structure is configured to operate a NAND logic gate.

18. The logic gate circuit structure of claim 11, wherein the plurality of first, second, and third transistors are a combination of low voltage threshold transistors and high voltage threshold transistors, wherein the logic gate circuit structure is configured to operate a NOR logic gate.

19. The logic gate circuit structure of claim 11, wherein the plurality of first, second, and third transistors are a combination of low voltage threshold transistors, high voltage threshold transistors, and standard voltage threshold transistors, wherein the logic gate circuit structure is configured to operate an XNOR logic gate.

20. The logical gate circuit structure of claim 11, wherein the plurality of first, second, and third transistors comprise PMOS transistors.

* * * * *